United States Patent
Li et al.

(10) Patent No.: US 10,523,214 B1
(45) Date of Patent: Dec. 31, 2019

(54) STABILIZED MICROWAVE-FREQUENCY SOURCE

(71) Applicant: HQPHOTONICS INC., Pasadena, CA (US)

(72) Inventors: Jiang Li, Pasadena, CA (US); Kerry Vahala, Pasadena, CA (US)

(73) Assignee: HQPHOTONICS INC., Pasadena, CA (US)

( * ) Notice: Subject to any disclaimer, the term of this patent is extended or adjusted under 35 U.S.C. 154(b) by 83 days.

(21) Appl. No.: 15/965,911

(22) Filed: Apr. 28, 2018

Related U.S. Application Data

(60) Provisional application No. 62/492,072, filed on Apr. 28, 2017.

(51) Int. Cl.
    H03L 7/06         (2006.01)
    H03L 5/00         (2006.01)
    (Continued)

(52) U.S. Cl.
    CPC ............ *H03L 7/06* (2013.01); *H01S 3/06708* (2013.01); *H01S 3/094049* (2013.01);
    (Continued)

(58) Field of Classification Search
    CPC ... H03L 7/06; H03L 5/00; H01S 5/065; H01S 3/06791; H01S 3/302; H01S 3/1305;
    (Continued)

(56) References Cited

U.S. PATENT DOCUMENTS

| 8,378,751 B2 * | 2/2013 | Fagg ...................... H03L 7/185 331/10 |
| 9,450,673 B2 | 9/2016 | Vahala et al. |

(Continued)

OTHER PUBLICATIONS

Li, J.; Yi, X.; Lee, H.; Diddams, S. A.; Vahala, K. J.; Electro-optical frequency division and stable microwave synthesis; Science 345(6194), 309-313 (2014).

(Continued)

*Primary Examiner* — Arnold M Kinkead
(74) *Attorney, Agent, or Firm* — David S. Alavi

(57) ABSTRACT

A voltage-controlled oscillator generates a VCO output signal at frequency $f_M$. A dual optical-frequency source generates optical signals at frequencies $v_{1S}$ and $v_{2S}$. An electro-optic frequency divider (EOFD) generates multiple optical sidebands spaced by $f_M$, and from two sidebands generates a beat signal at beat frequency $\delta f$. A first control circuit generates an error signal from the beat signal and a first reference signal at frequency $f_{REF1}$, and couples the VCO and the EOFD in a negative feedback arrangement that stabilizes the output frequency $f_M$. A second control circuit generates an error signal from the frequency-divided output signal and a second reference signal at frequency $f_{REF2}$, and couples the VCO and one or both of the dual source or the first reference signal in a negative feedback arrangement that stabilizes, or compensates for fluctuations of, a difference frequency $v_{2S}-v_{1S}$.

31 Claims, 16 Drawing Sheets

(51) Int. Cl.
*H01S 3/11* (2006.01)
*H04B 10/50* (2013.01)
*H01S 3/094* (2006.01)
*H01S 3/13* (2006.01)
*H04B 10/2507* (2013.01)
*H01S 5/065* (2006.01)
*H01S 3/067* (2006.01)
*H04B 10/25* (2013.01)
*H01S 3/30* (2006.01)

(52) U.S. Cl.
CPC ...... *H01S 3/094096* (2013.01); *H01S 3/1109* (2013.01); *H01S 3/1305* (2013.01); *H01S 3/302* (2013.01); *H01S 5/065* (2013.01); *H03L 5/00* (2013.01); *H04B 10/2504* (2013.01); *H04B 10/2507* (2013.01); *H04B 10/503* (2013.01); *H04B 2210/006* (2013.01)

(58) Field of Classification Search
CPC ........... H01S 3/06708; H01S 3/094096; H01S 3/094049; H01S 3/1109; H04B 10/2507; H04B 10/2504; H04B 10/503

USPC ............ 331/2, 10, 46, 47; 372/32; 398/192; 370/503
See application file for complete search history.

(56) References Cited

U.S. PATENT DOCUMENTS

| | | |
|---|---|---|
| 9,537,571 B2 | 1/2017 | Li et al. |
| 9,905,999 B2 | 2/2018 | Li et al. |
| 10,009,103 B2 | 6/2018 | Vahala et al. |
| 2017/0302048 A1 | 10/2017 | Li et al. |

OTHER PUBLICATIONS

M. Fujiwara, et al; Flattened optical multicarrier generation of 12.5 GHz spaced 256 channels based on sinusoidal amplitude and phase hybrid modulation; Electron. Lett. 37, 967-968 (2001).

C. B. Huang, et al; Nonlinearly broadened phase-modulated continuous-wave laser frequency combs characterized using DPSK decoding; Opt.Express 16, 2520-2527 (2008).

* cited by examiner

STABILIZED MICROWAVE-FREQUENCY SOURCE

BENEFIT CLAIM

This application claims benefit of U.S. provisional App. No. 62/492,072 filed Apr. 28, 2017 in the names of Jiang Li and Kerry Vahala, said provisional application being hereby incorporated by reference as if fully set forth herein.

STATEMENT REGARDING FEDERALLY SPONSORED RESEARCH

This invention was made with government support under Contract No. W911QX-13-C-0140 awarded by the U.S. Army Contracting Command. The government has certain rights in the invention.

FIELD OF THE INVENTION

The field of the present invention relates to generating microwave-frequency electrical signals, and microwave-frequency sources for generating those signals, that utilize a dual optical-frequency source and electro-optical frequency division. In particular, apparatus and methods are described herein for reducing drift or fluctuations of the difference between the optical frequencies of the dual-frequency optical source, thereby also reducing drift or fluctuations of the frequency of the generated microwave-frequency electrical signal.

BACKGROUND

Low-phase-noise single-frequency electrical sources are employed in numerous demanding applications including coherent communications, radar, radio astronomy, frequency metrology, and test and measurement. The use of a dual-frequency optical source in conjunction with electro-optical frequency division (EOFD) has enables construction of high-performance, ultra-low-phase-noise microwave-frequency sources. Such a state-of-the-art microwave source operating at 30 GHz has exhibited phase noise of −150 dBc/Hz at 10 kHz offset. That low level of phase noise is an improvement of about 30 dB relative to conventional microwave oscillators (e.g., based on up-converting from quartz or SAW oscillators). Electro-optical frequency division typically employs two lasers with high relative-frequency stability as the dual-frequency optical source, and electro-optical-modulator-generated optical frequency combs for the frequency division. The phase noise exhibited by the resulting microwave-frequency electrical signal is reduced by a factor of about $N^2$ relative to the optical phase noise of the dual-frequency optical source, where N is the frequency division factor. However, any long-term frequency drift or fluctuations between the optical frequencies of the dual-frequency optical source are transferred to the microwave-frequency electrical signal, divided by N as a result of the electro-optical frequency division.

Examples of dual-frequency optical sources or electro-optic frequency division suitable for generating low-phase-noise microwave-frequency electrical signals are disclosed in:

[1] Li, J.; Yi, X.; Lee, H.; Diddams, S. A.; Vahala, K. J.; Electro-optical frequency division and stable microwave synthesis; Science 345(6194), 309-313 (2014);

[2] U.S. Pat. No. 9,450,673 entitled "Stabilized microwave-frequency source" issued Sep. 20, 2016 to Vahala et al;

[3] U.S. Pat. No. 9,537,571 entitled "Dual-frequency optical source" issued Jan. 3, 2017 to Li et al;

[4] U.S. Pub. No. 2016/0254646 entitled "Optical frequency divider based on an electro-optical-modulator frequency comb" published Sep. 1, 2016 in the names of Li et al;

[5] U.S. provisional App. No. 62/270,756 entitled "Dual SBS lasers from a non-reciprocal fiber cavity for stable microwave generation" filed Dec. 22, 2015 in the names of Li et al; and

[6] U.S. Pub. No. 2017/0302048 entitled "Stabilized non-reciprocal fiber-ring Brillouin laser source" published Oct. 19, 2017 in the names of Li et al.

Each of the preceding references in incorporated by reference as if fully set forth herein. In one or more of those references, the dual-frequency optical source comprises the dual stimulated Brillouin lasers (SBL) co-lasing from a high finesse optical resonator. The resonator typically is placed in a temperature-stabilized enclosure or housing. Temperature drift or fluctuations of the optical resonator will change its optical path length (due to both thermal expansion/contraction and refractive index change with temperature), thereby also changing the frequency difference between the dual Brillouin lasers as well as the resulting divided microwave frequency. In addition, some practical applications require that a given microwave-frequency source be phase locked or synchronized with an external clock signal with high long-term stability. It therefore would be desirable to develop methods for synchronizing the EOFD-based microwave-frequency source to an external reference or to improve the long term stability of the EOFD-based microwave-frequency source.

SUMMARY

An inventive microwave-frequency source, for generating an output electrical signal at an output frequency $f_M$, comprises a voltage-controlled electrical oscillator (VCO), a dual optical-frequency reference source (DOFRS), an electro-optic frequency divider (EOFD), first and second electrical reference oscillators, an electrical frequency divider, and first and second electrical control circuits. The VCO generates a VCO output electrical signal at the frequency $f_M$, a first portion of which forms the output electrical signal of the microwave-frequency source. The DOFRS generates first and second optical reference signals at respective first and second optical reference frequencies $v_{1S}$ and $v_{2S}$, with $v_{2S} > v_{1S}$. The EOFD (i) receives a second portion of the VCO output electrical signal, (ii) receives the first and second optical reference signals, (iii) generates a set of multiple sideband optical signals at respective sideband optical frequencies spaced by $f_M$, and (iv) generates from two of the sideband optical signals a beat electrical signal at a beat frequency $\delta f$.

The first and second electrical reference oscillators generate respective first and second reference electrical signals at respective first and second reference frequencies $f_{REF1}$ and $f_{REF2}$. The first electrical control circuit (i) generates a first electrical error signal dependent on relative phase of the beat electrical signal and the first reference electrical signal, and (ii) couples the VCO and the EOFD in a negative feedback arrangement, based on the first electrical error signal, that stabilizes the output frequency $f_M$. The electrical frequency divider generates from a third portion of the VCO output electrical signal a divided VCO output electrical signal at a frequency $f_M/m$, wherein m is a division factor characterizing the electrical frequency divider. The second electrical control circuit generates a second electrical error signal dependent on relative phase of the divided VCO output electrical signal and the second reference electrical signal, and also does one or both of (ii) coupling the VCO and the DOFRS in a negative feedback arrangement, based on the second electrical error signal, that stabilizes an optical reference difference frequency $v_{2S}-v_{1S}$, or (iii) coupling the VCO and the first electrical reference oscillator in a negative feedback arrangement, based on the second electrical error signal, that alters the first reference frequency $f_{REF1}$ so as to at least partly compensate for fluctuations of the optical reference difference frequency $v_{2S}-v_{1S}$. The second electrical control circuit can couple the VCO to only the DOFRS, to only the first reference oscillator, or to both.

Objects and advantages pertaining to microwave-frequency sources may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The embodiments depicted are shown only schematically; all features may not be shown in full detail or in proper proportion, certain features or structures may be exaggerated relative to others for clarity, and the drawings should not be regarded as being to scale. The embodiments shown are only examples, and should not be construed as limiting the scope of the present disclosure or appended claims.

DETAILED DESCRIPTION OF EMBODIMENTS

Figure 1:
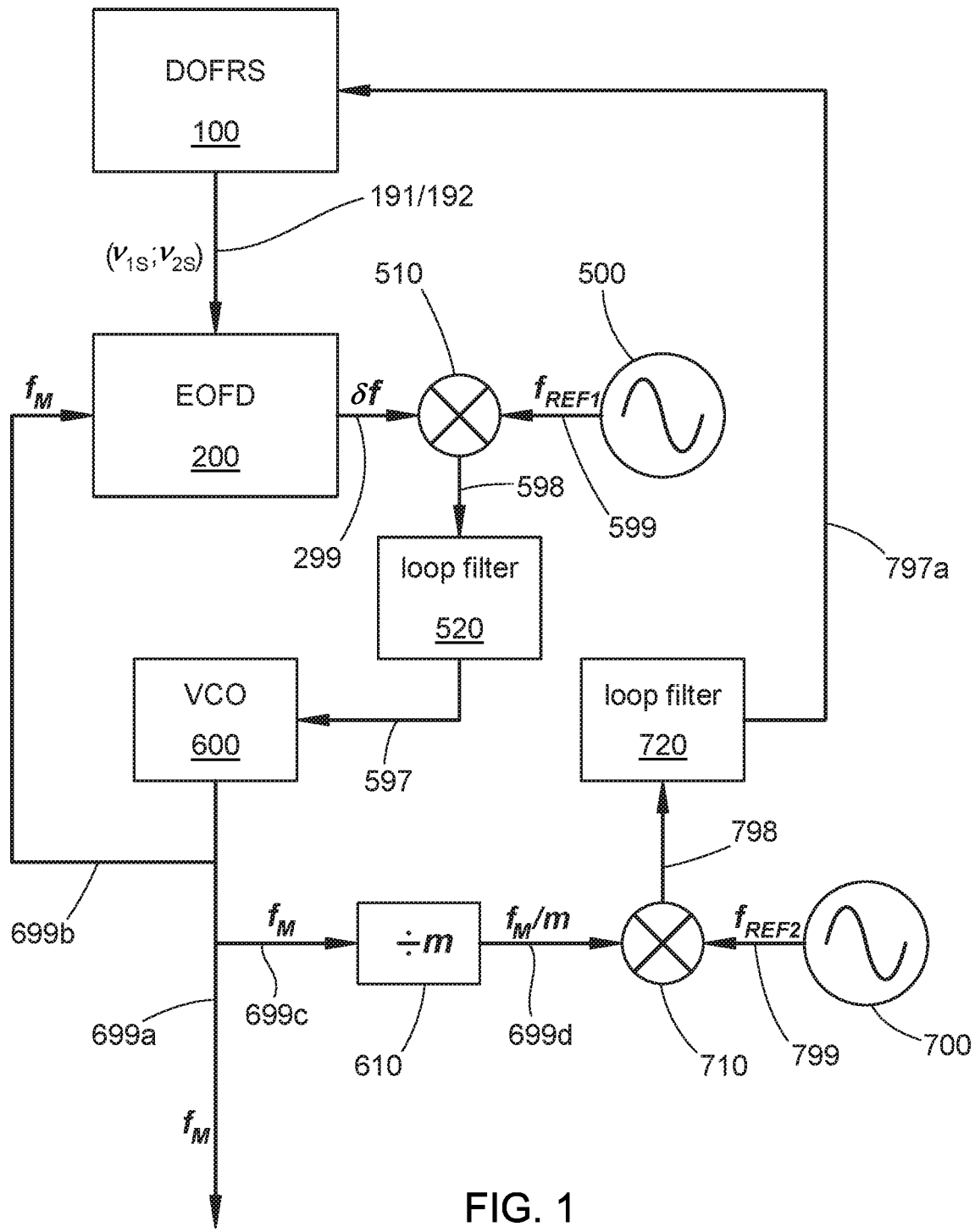
FIG. 1 illustrates schematically a first example of an inventive stabilized microwave-frequency source.
Figure 2:
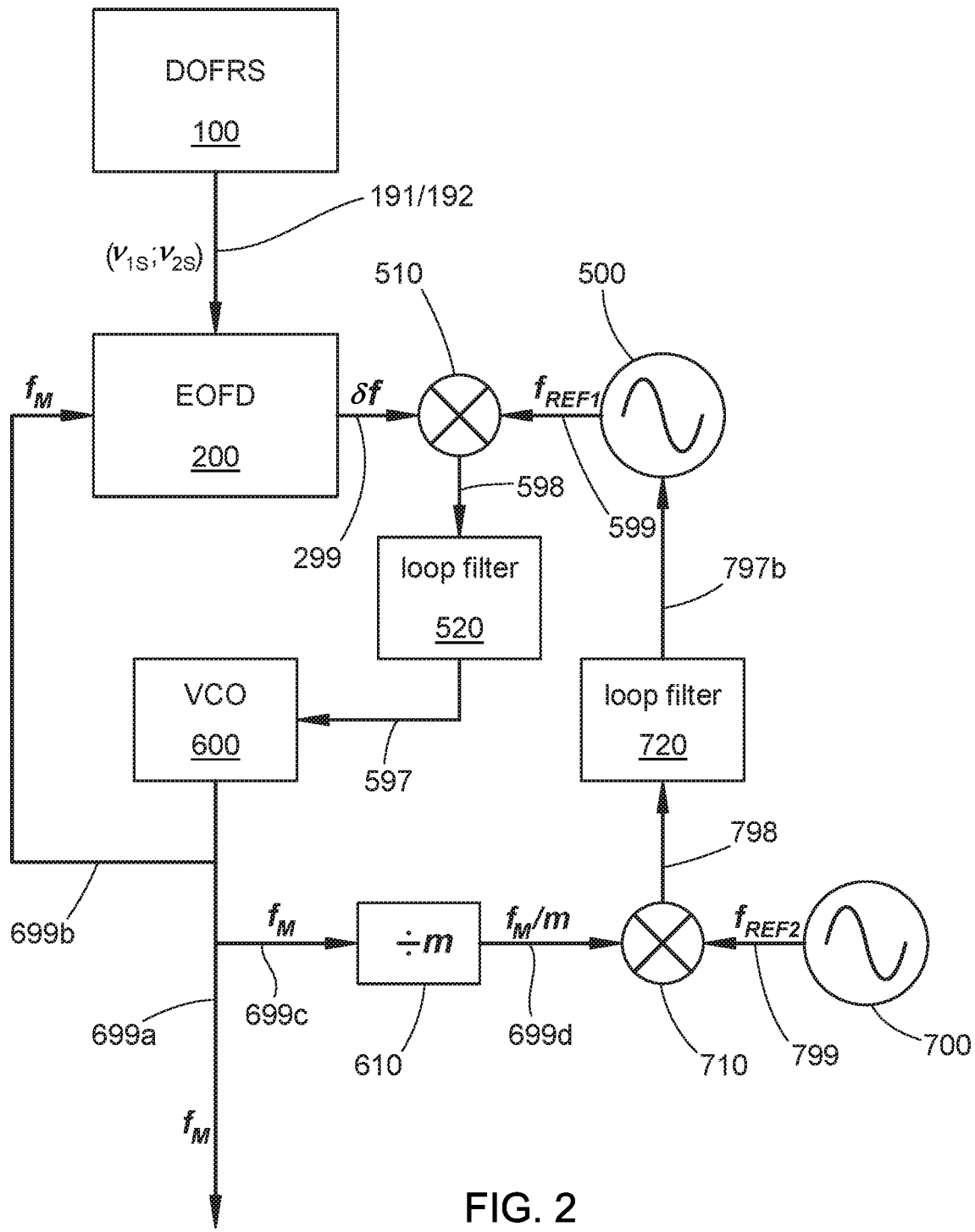
FIG. 2 illustrates schematically a second example of an inventive stabilized microwave-frequency source.
Figure 3:
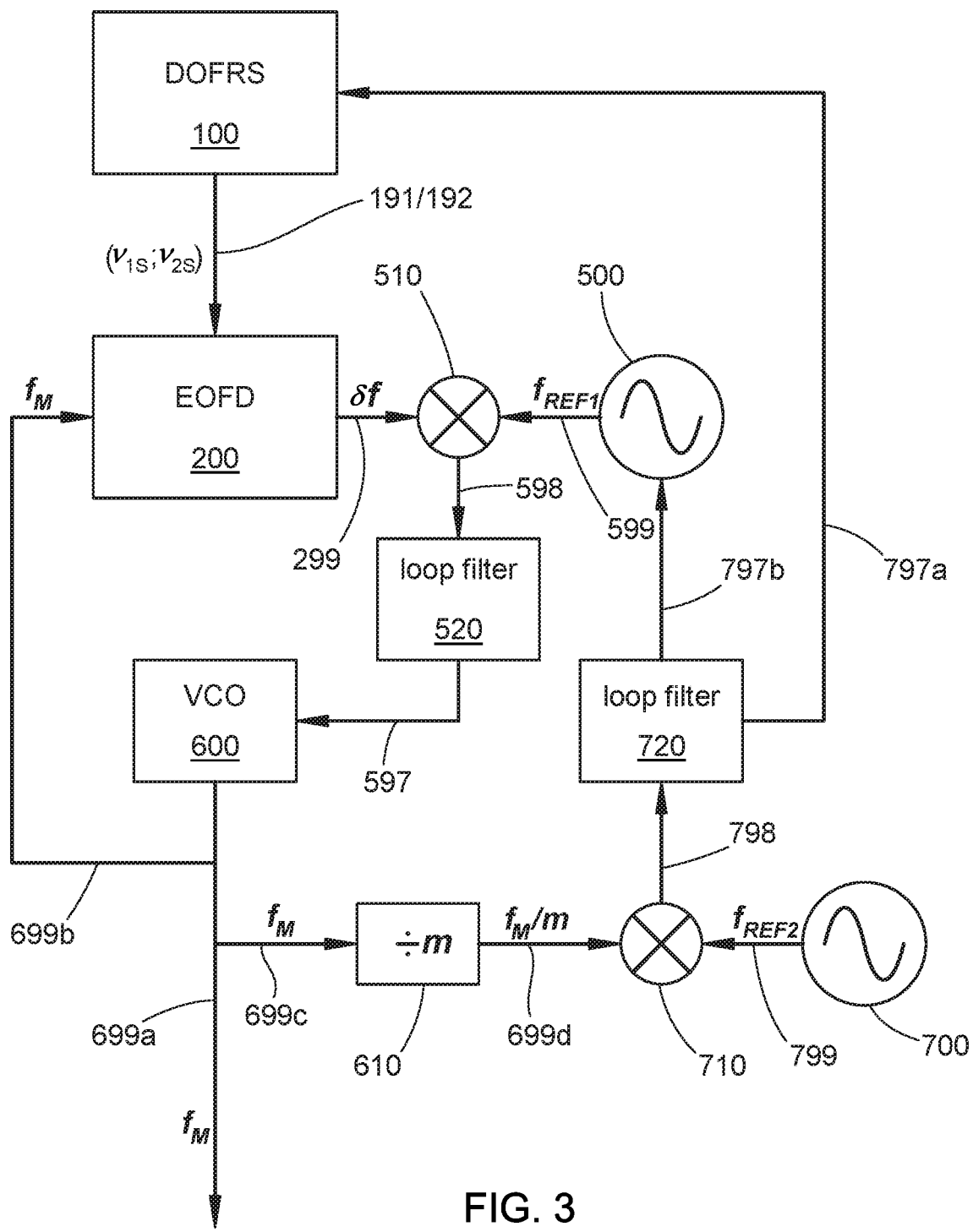
FIG. 3 illustrates schematically a third example of an inventive stabilized microwave-frequency source.

An inventive microwave-frequency source, for generating an output electrical signal at an output frequency $f_M$, comprises a voltage-controlled electrical oscillator (VCO) 600, a dual optical-frequency reference source (DOFRS) 100, an electro-optic frequency divider (EOFD) 200, first and second electrical reference oscillators 500 and 700, respectively, an electrical frequency divider 610, and first and second electrical control circuits. Example embodiments are illustrated schematically in FIGS. 1 through 3. The VCO 600 generates a VCO output electrical signal at the frequency $f_M$, a first portion of which forms the output electrical signal 699a of the microwave-frequency source. The DOFRS 100 generates first and second optical reference signals 191/192 at respective first and second optical reference frequencies $v_{1S}$ and $v_{2S}$, with $v_{2S}>v_{1S}$. The EOFD 200 (i) receives a second portion 699b of the VCO output electrical signal, (ii) receives the first and second optical reference signals 191/192, (iii) generates a set of multiple sideband optical signals at respective sideband optical frequencies spaced by $f_M$, and (iv) generates from two of the sideband optical signals a beat electrical signal 299 at a beat frequency $\delta f$.

The first and second electrical reference oscillators 500 and 700, respectively, generate respective first and second reference electrical signals 599 and 799 at respective first and second reference frequencies $f_{REF1}$ and $f_{REF2}$. The first electrical control circuit can be of any suitable type or arrangement. The examples of the drawings include a comparator portion 510 and loop filter portion 520 operating as part of a phase-locked loop; other suitable types or arrangements of control, feedback, or servo circuits can be employed. The first electrical control circuit (i) generates a first electrical error signal 598 dependent on relative phase of the beat electrical signal 299 and the first reference electrical signal 599, and (ii) couples the VCO 600 and the EOFD 200 (e.g., via the control signal 597) in a negative feedback arrangement, based on the first electrical error signal 598, that stabilizes the output frequency $f_M$. Various examples of EOFDs and suitable feedback arrangements between the VCO 600 and the EOFD 200 are described further below and also disclosed in, e.g., U.S. Pat. No. 9,450,673 and U.S. Pub. No. 2016/0254646, which are incorporated by reference. The EOFD 200 essentially acts to divide an optical reference difference frequency $v_{2S}-v_{1S}$ by the output frequency $f_M$, in some cases reducing, (within the feedback locking bandwidth of the first electrical circuit) phase noise on the output signal 699a by a factor as large as about $((v_{2S}-v_{1S})/f_M)^2$ (relative to phase noise of the optical reference difference frequency signal at the optical reference difference frequency $v_{2S}-v_{1S}$). While the feedback arrangement provided by the first electrical control circuit can significantly reduce phase noise on the microwave output signal 699a at frequency $f_M$, that output signal is still susceptible to fluctuations of the optical reference difference frequency $v_{2S}-v_{1S}$.

The electrical frequency divider 610 generates from a third portion 699c of the VCO output electrical signal a divided VCO output electrical signal 699d at a frequency $f_M/m$, wherein m is a division factor characterizing the frequency divider 610. In some examples m can be a positive integer. The second electrical control circuit can be of any suitable type or arrangement. The examples of the drawings include a comparator portion 710 and a loop filter portion 720 operating as part of a phase-locked loop; other suitable types or arrangements of control, feedback, or servo circuits can be employed. The second electrical control circuit generates a second electrical error signal 798 dependent on relative phase of the divided VCO output electrical signal 699d and the second reference electrical signal 799. In some examples (e.g., FIGS. 1 and 3), the second electrical control circuit couples the VCO 600 and the DOFRS 100 (via the control signal 797a) in a negative feedback arrangement, based on the second electrical error signal 798, that stabilizes the optical reference difference frequency $v_{2S}-v_{1S}$ (i.e., that reduces or substantially eliminates fluctuations of the optical reference difference frequency $v_{2S}-v_{1S}$ over relatively long timescales, e.g., seconds, hours, or one or more days). In some examples (e.g., FIGS. 2 and 3), the second electrical control circuit couples the VCO 600 and the first electrical reference oscillator 500 (via the control signal 797b) in a negative feedback arrangement, based on the second electrical error signal 798, that alters the first reference frequency $f_{REF1}$ so as to at least partly compensate for fluctuations of the optical reference difference frequency $v_{2S}$–$v_{1S}$ (i.e., to alter $f_{REF1}$ in response to a fluctuation of the optical reference difference frequency $v_{2S}$–$v_{1S}$ in a way that reduces or substantially eliminates a corresponding fluctuation of $f_M$). In some examples (e.g., FIG. 3), the second electrical control circuit couples the VCO 600 to both the DOFRS 100 and the first electrical reference oscillator 500 as described above.

In some examples, the second electrical control circuit couples the VCO 600 to only the DOFRS 100 (e.g., as in FIG. 1), to act directly to reduce fluctuations of the optical reference difference frequency $v_{2S}$–$v_{1S}$. In some of those examples, providing such feedback control of only the optical reference difference frequency $v_{2S}$–$v_{1S}$ can limit phase noise on the output signal 699a to a sufficiently low level. In some other examples, the second electrical control circuit couples the VCO 600 to only the first reference oscillator 500 (e.g., as in FIG. 2), to act indirectly to compensate for fluctuations of the optical reference difference frequency $v_{2S}$–$v_{1S}$ by altering the first reference frequency $f_{REF1}$. In some of those examples, providing such feedback control of only the first reference frequency $f_{REF1}$ can limit phase noise on the output signal 699a to a sufficiently low level. The arrangement of FIG. 2 can be advantageously employed in examples wherein altering the optical reference difference frequency $v_{2S}$–$v_{1S}$ might be problematic or impracticable (e.g., in examples wherein the first and second optical reference frequencies $v_{1S}$ and $v_{2S}$ are locked to respective atomic or molecular spectral lines). In still other examples, the second electrical control circuit couples the VCO 600 to both the DOFRS 100 and the first reference oscillator 500 (e.g., as in FIG. 3), to act both directly (by reducing fluctuations of the optical reference difference frequency $v_{2S}$–$v_{1S}$) and indirectly (by altering the first reference frequency $f_{REF1}$ to compensate for residual fluctuations of the optical reference difference frequency $v_{2S}$–$v_{1S}$). In some of those examples, phase noise on the output signal 699a can be limited to below levels achievable using either coupling scheme alone. The respective portions of the second electrical control circuit that couple the DOFRS 100 and the reference oscillator 500 to the VCO 600 (e.g., as in FIG. 3) can comprise discrete, separate circuits, or can comprise functionally distinct portions of a common circuit. Likewise, the first and second electrical control circuits can comprise discrete, separate circuits, or can comprise functionally distinct portions of a common circuit.

The second electrical reference oscillator 700 can be of any suitable type or arrangement. In some examples, a crystal-based electronic oscillator or other fixed-frequency electronic oscillator can be suitably employed. In some examples, the reference oscillator 700 can be employed for synchronizing the output signal 699a with an external clock, oscillator, or trigger signal.

In examples wherein the second electrical control circuit is arranged to alter the first reference frequency $f_{REF1}$, the second electrical circuit can be arranged in any suitable way to generate the control signal 797b. In some examples, a comparator 710 and the loop filter 720 can be employed as part of a phase-locket loop; other suitable feedback or servo arrangements can be employed. The first electrical reference oscillator 500 can be of any suitable type or arrangement for generating the first reference electrical signal 599 and for enabling alteration of the first reference frequency $f_{REF1}$ in response to the control signal 797b. In some examples, the reference oscillator 500 can include a voltage controlled oscillator or other tunable electronic oscillator.

In examples wherein the second electrical control circuit is not arranged to alter the first reference frequency $f_{REF1}$ (e.g., as in FIG. 1), the reference oscillator 500 need not be tunable, and in fact it would be desirable in many instances if it were not tunable so as to enhance the stability of $f_{REF1}$. In such instances, a crystal-based electronic oscillator or other fixed-frequency electronic oscillator can be suitably employed.

In examples wherein the second electrical control circuit is arranged to stabilize the optical reference difference frequency $v_{2S}$–$v_{1S}$, the second electrical circuit can be arranged in any suitable way to generate the control signal 797a. In some examples, a comparator 710 and the loop filter 720 can be employed as part of a phase-locket loop; other suitable feedback or servo arrangements can be employed. In a common arrangement, the DOFRS 100 includes an optical resonator (e.g., a Fabry-Perot resonator cavity, a ring or disk resonator, a fiber-loop resonator, or a fiber Fabry-Perot resonator), and one or both of the first or second optical reference frequencies $v_{1S}$ or $v_{2S}$ are resonant in corresponding resonant optical modes of the optical resonator. In some examples, the optical reference signals 191/192 are coupled into the optical resonator and their respective sources are frequency-locked by any suitable technique to corresponding resonant optical modes of the resonator. In other examples, one or more optical pump sources are frequency-locked to resonant modes of the resonator and generate therein the optical reference signals 191/192 at the corresponding optical reference frequencies $v_{1S}$ and $v_{2S}$. In some examples each optical reference signal 191/192 is generated by a corresponding pump source. In other examples, a single pump source generates both optical reference signals 191/192, e.g., by cascaded Brillouin lasing; such a source can be referred to as a dual mode source.

In examples wherein the DOFRS 100 includes an optical resonator, the second electrical control circuit can be arranged so as to alter corresponding optical frequencies of resonant optical modes of the resonator, thereby altering the optical reference difference frequency $v_{2S}$–$v_{1S}$. Various arrangements for achieving that result are described below. Controlled alteration of the resonant optical frequencies of the optical resonator can be achieved in any suitable way, including altering the resonator length (e.g., using a fiber stretcher or movable resonator optical components) or the resonator modal indices (e.g., thermally, acousto-optically, stress-optically, electro-optically, or magneto-optically).

In some examples (e.g., FIGS. 4 through 9), the DOFRS 100 includes first and second pump laser sources 130a/130b and the optical resonator 110/110' is characterized by a Brillouin shift frequency vs. One or both of the first and second pump laser sources 130a/130b is frequency-locked at one or both corresponding first and second pump optical frequencies $v_1$ and $v_2$ to corresponding resonant optical modes of the optical resonator 110/110'. The first and second optical reference signals at the first and second optical reference frequencies $v_{1S}$ and $v_{2S}$ comprise stimulated Brillouin laser output generated by optical pumping of the optical resonator 110/110' simultaneously by the first and second pump laser sources, with $v_1$–$v_{1S}$ and $v_2$–$v_{2S}$ each being substantially equal to $v_B$ (typically) or an integer multiple thereof (less commonly; e.g., as in a cascaded Brillouin laser source). The optical resonator 110/110' is arranged so that the first and second optical reference frequencies $v_{1S}$ and $v_{2S}$ also are resonant in corresponding resonant optical modes.

Figure 4:
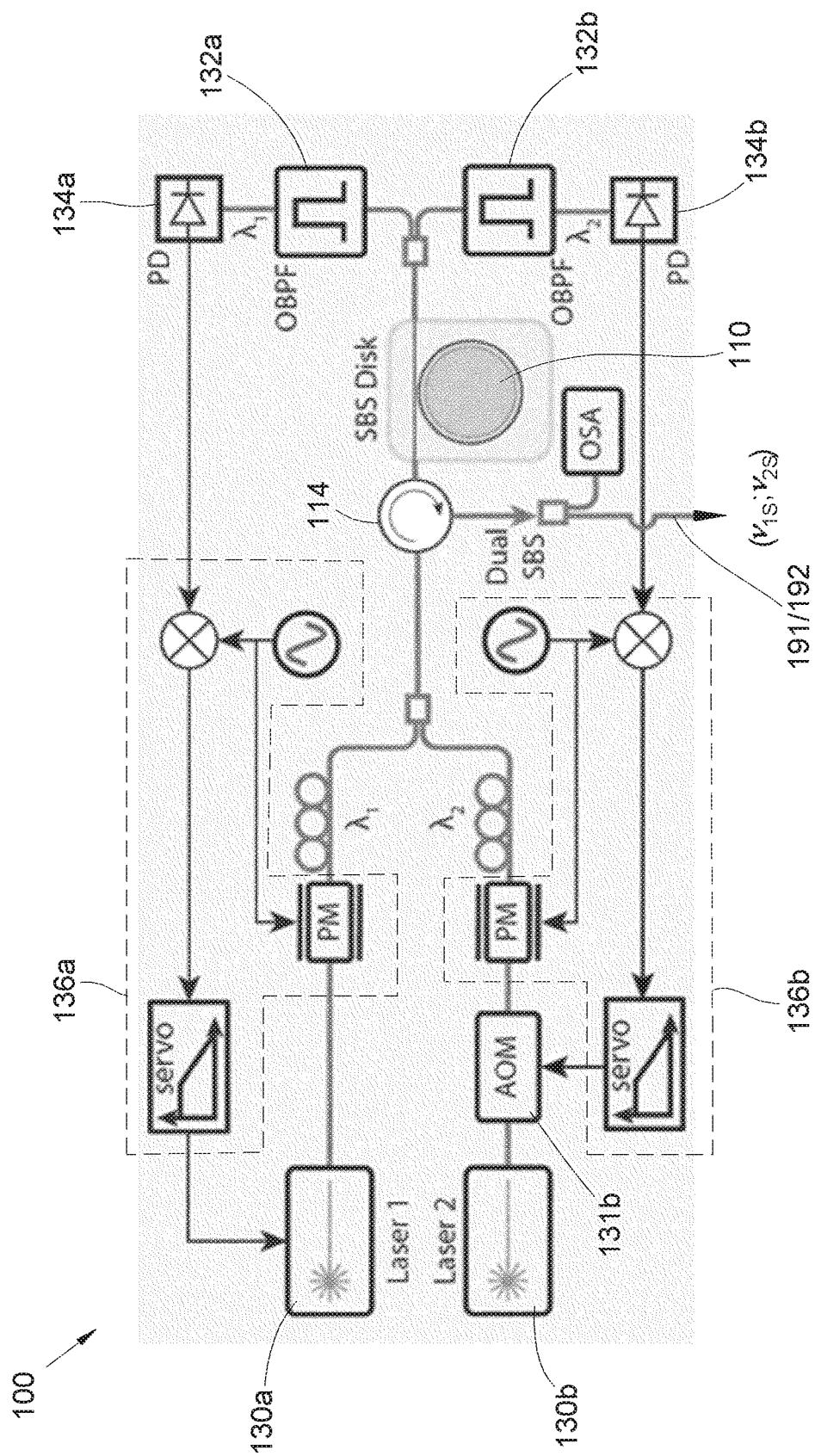
FIGS. 4-9 illustrate schematically various examples of dual optical frequency reference sources.
Figure 5:
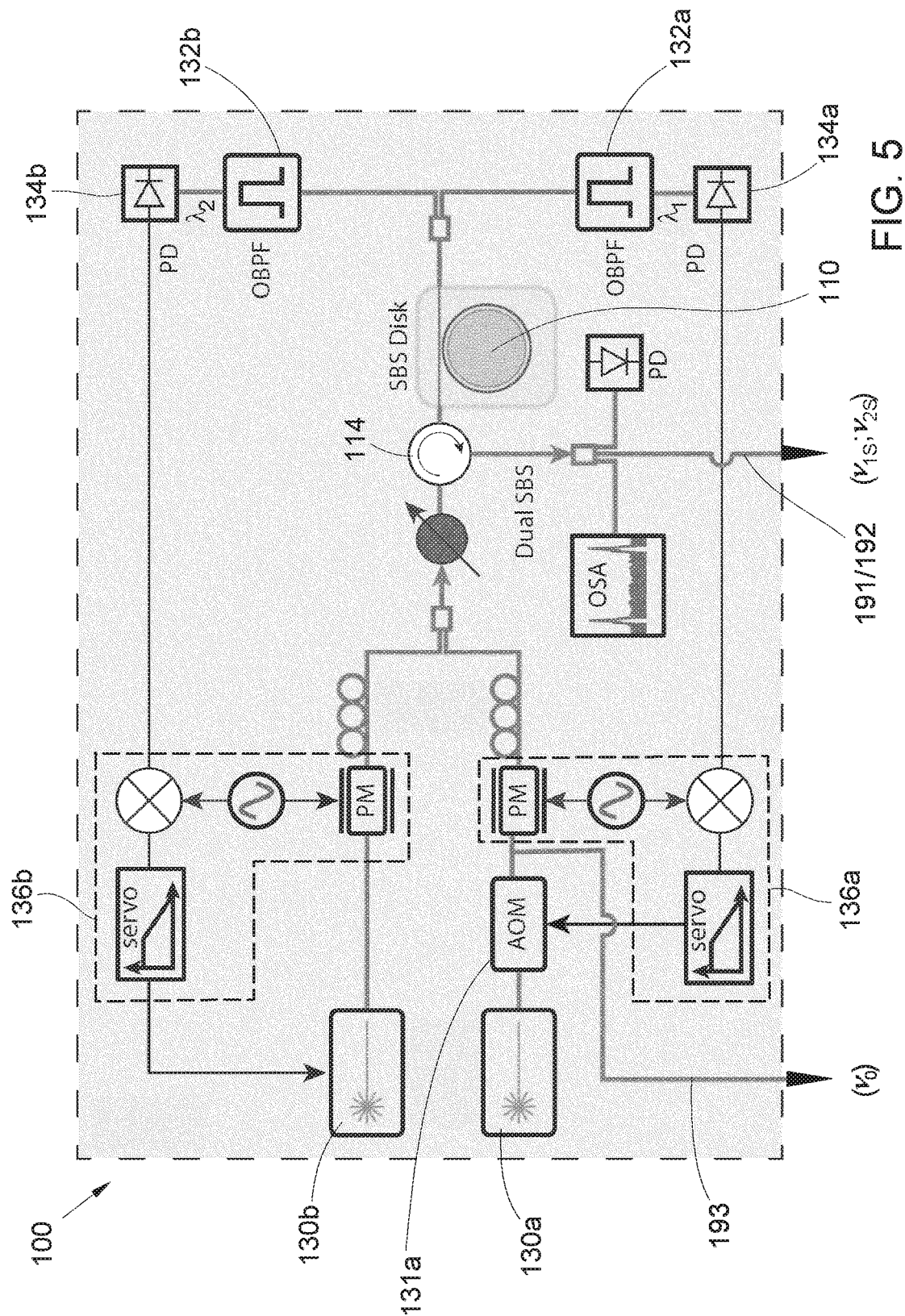

FIGS. 4 through 9 illustrate schematically various examples of DOFRSs 100 that can be employed in an inventive microwave-frequency source. Some are disclosed in U.S. Pat. Nos. 9,450,673, 9,537,57, U.S. Pub. No. 2016/0254646, U.S. provisional App. No. 62/270,756, and U.S. Pub. No. 2017/0302048, each of which is incorporated by reference. In the examples of FIGS. 4 and 5, the optical reference signals 191/192 are provided by Brillouin laser lines co-lasing within a single silica-on-silicon high-Q disk resonator 110. The silica disk resonator 110 can be designed and fabricated with a free-spectral-range (FSR) of about 10.890 GHz that substantially matches the Brillouin shift frequency in silica at a pump wavelength of 1550 nm or an integer submultiple thereof. Other needed, desired, or suitable materials can be employed that exhibit different Brillouin shift frequencies, and the disk resonator can be arranged accordingly. Each pump laser 130a/130b (emitting at corresponding pump optical frequencies $v_1$ and $v_2$) is frequency-locked to a corresponding distinct resonant optical mode of the disk resonator 110 using the Pound-Drever-Hall (PDH) technique, is coupled into the disk resonator 110 through a circulator 114 (which also couples the optical reference signals 191/192 out of the DOFRS 100), and excites its own corresponding Brillouin laser in the backward-propagating direction at respective optical reference frequencies $v_{1S}$ and $v_{2S}$. The PDH technique is implemented for each pump laser 130a/130b by employing respective optical bandpass filters 132a/132b, photodetectors 134a/134b, and feedback/servo mechanisms 136a/136b; control of each pump wavelength can be via direct laser control (as with pump laser 130a) or via frequency shifting of the laser output (as with acousto-optic shifting of the output of pump laser 130b). Any other suitable frequency-locking technique can be employed, e.g., the Hänsch-Couillaud technique. The frequency separation (i.e., the optical reference difference frequency $v_{2S}-v_{1S}$) between the two SBS lasers can be readily tuned by tuning the pump lasers 130a/130b to pump at resonator modes with different azimuthal mode orders.

Figure 6:
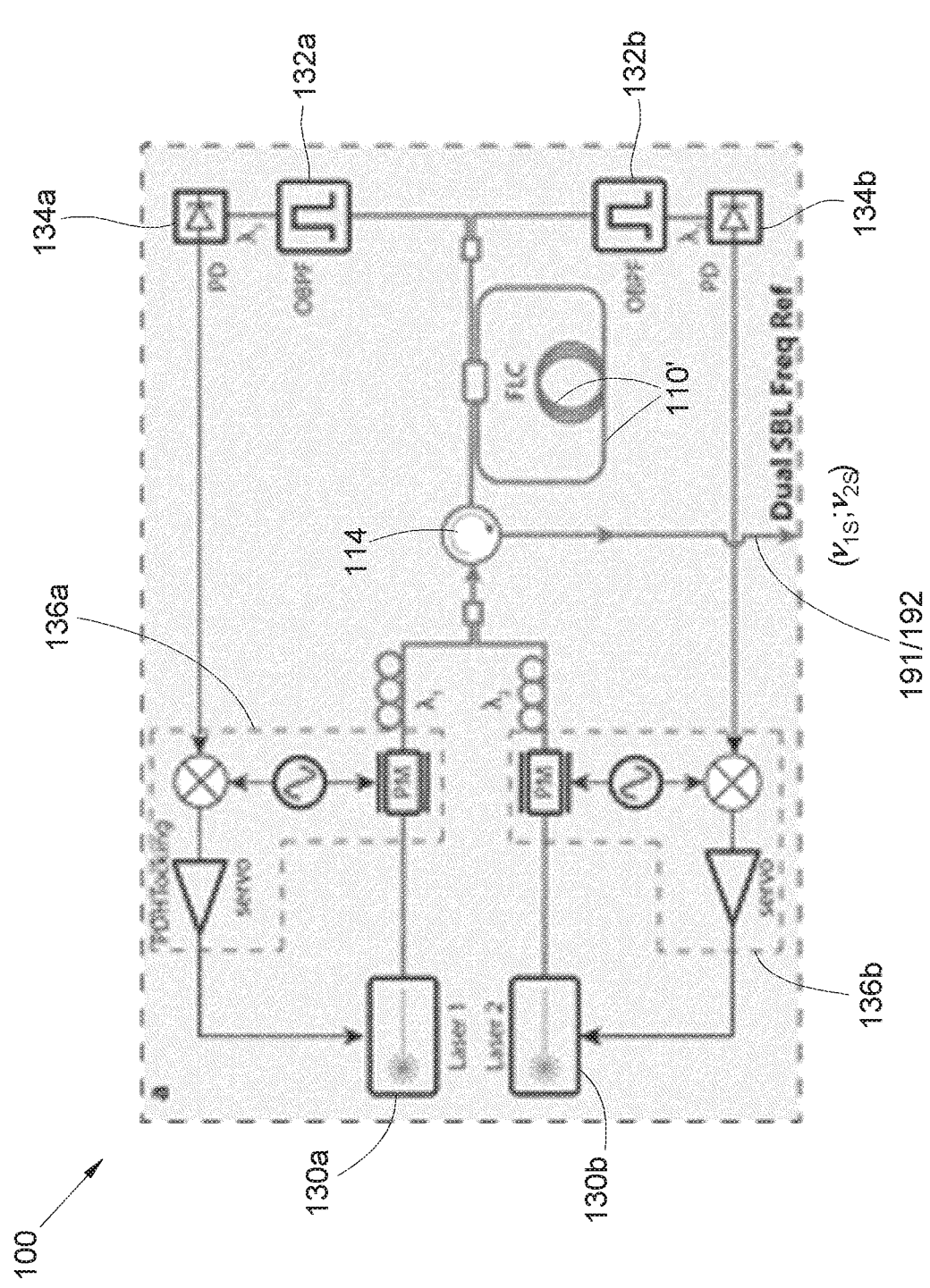
Figure 7:
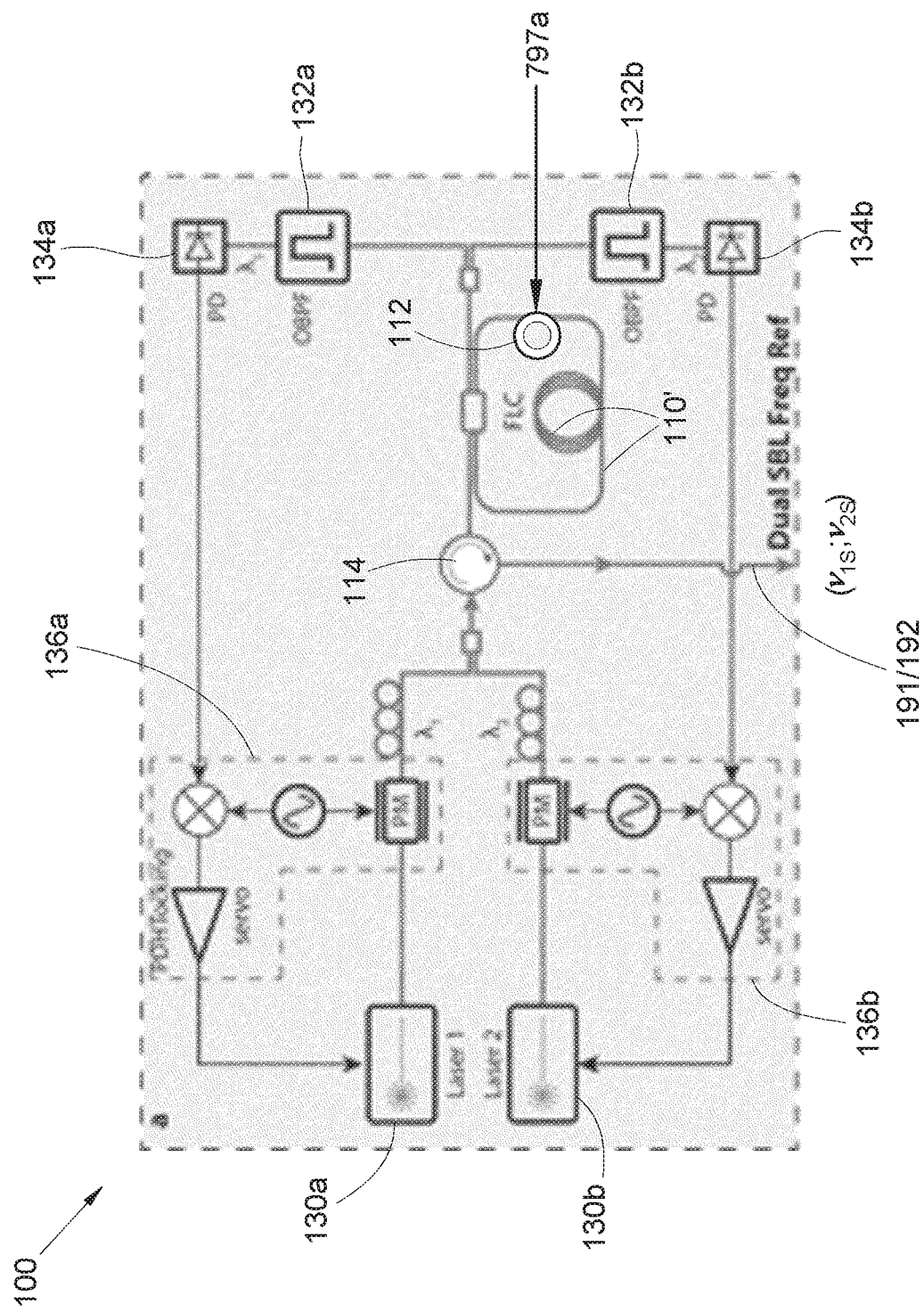
Figure 8:
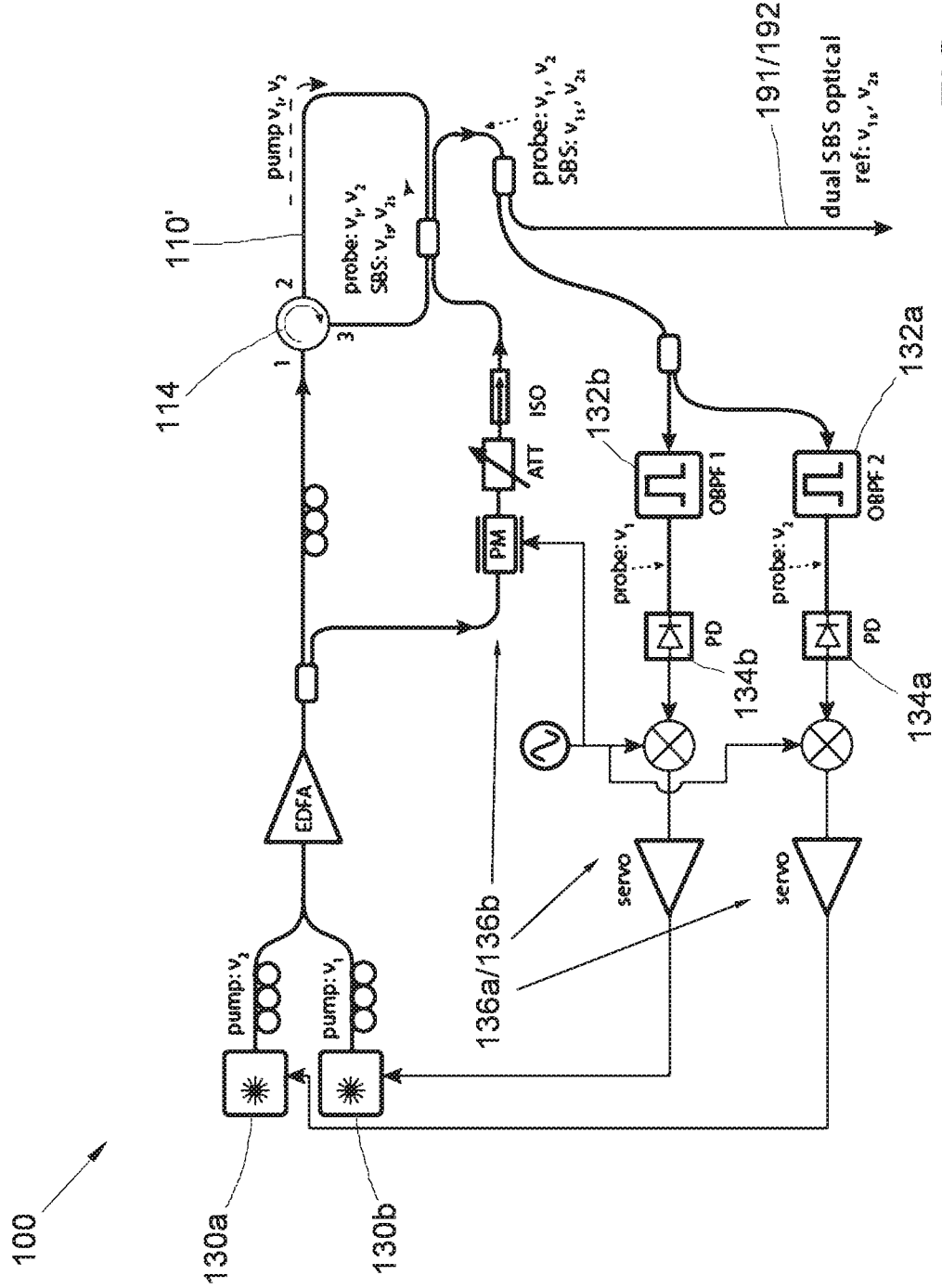
Figure 9:
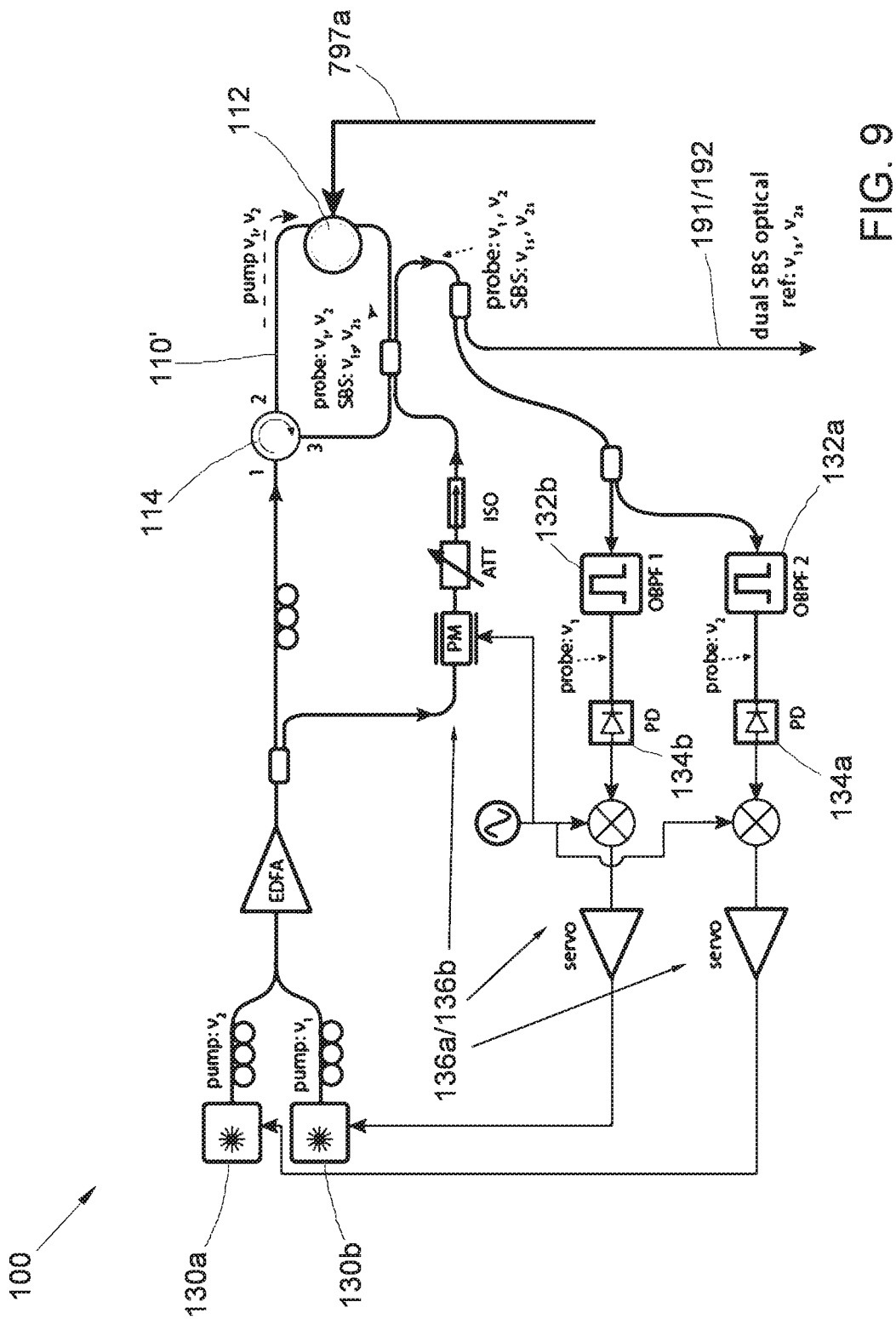

FIG. 6 shows a similar example wherein the disk resonator 110 has been replaced by a fiber-loop optical resonator 110' (i.e., a fiber-loop cavity or FLC). The example of FIG. 7 is similar to the example of FIG. 6 except that a mechanical fiber-stretcher 112 has been added for altering the length (and hence the resonant frequencies) of the fiber-loop resonator 110'. The example FIG. 8 is similar to the example of FIG. 6, and the example of FIG. 9 is similar to FIG. 7, except that the circulator 114 has been incorporated into the fiber-loop resonator 110' so that resonant optical modes propagate in only one direction around the resonator 110'. In the examples of FIGS. 4 through 7, resonant optical modes can propagate in both directions around the resonator 110/110'.

In the examples of FIGS. 4 and 5, which include a disk resonator 110, if tuning of the optical reference difference frequency $v_{2S}-v_{1S}$ is desired (e.g., for use in the examples of FIG. 1 or 3), that can be accomplished, e.g., by temperature tuning of the disk resonator 110, by tuning a voltage applied to an electro-optic material incorporated into at least a portion of the disk resonator 110, or by tuning a stress applied to a photoelastic material incorporated into at least a portion of the disk resonator 110. Such thermal, electro-optic, or stress-optic tuning is actuated in response to the control signal 797a. Similar arrangements (i.e., temperature tuning or electro-optic tuning) can be implemented in the examples of FIG. 6 or 8, which include a fiber-loop resonator 110'. Tuning of the optical reference difference frequency $v_{2S}-v_{1S}$ can be readily achieved in the examples of FIG. 7 or 9; each includes a fiber-loop resonator 110' that also includes a fiber stretcher 112 (typically piezoelectrically actuated). Altering the length of the fiber-loop resonator 110' using the stretcher 112, in response to the control signal 797a, alters the resonance frequencies of the fiber-loop resonator 110' and hence the optical reference difference frequency $v_{2S}-v_{1S}$. In some of the foregoing schemes for tuning the optical reference difference frequency $v_{2S}-v_{1S}$, feedback bandwidth limitations are imposed by the nature of the mechanism employed. For example, many piezoelectric or photoelastic devices exhibit frequency response only up to ten or a few tens of kHz. In other examples that are not so limited (e.g., an electro-optically tuned resonator), it may be desirable to limit the feedback bandwidth of the second electrical control circuit to below similar limits, so as to reduce the likelihood of interference between the first and second electrical control circuits when they operate simultaneously. In some examples, it may be desirable to limit the feedback bandwidth of the second electrical control circuit to less than a few tens of Hz, so the to reduce only longer-term fluctuations of the optical reference difference frequency $v_{2S}-v_{1S}$ (e.g., over seconds, hours, or one or more days).

Figure 10:
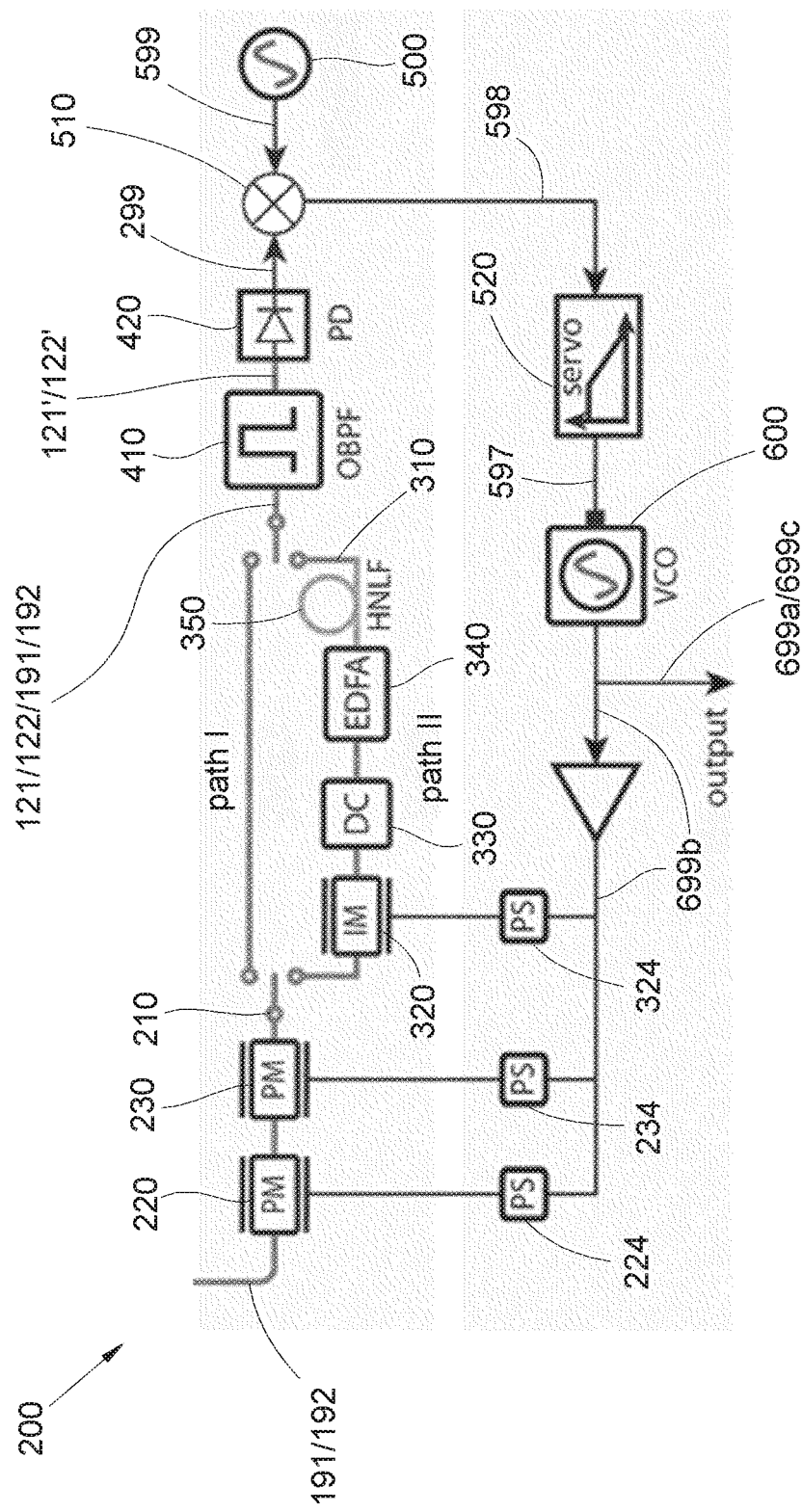
FIG. 10 illustrates schematically an example electro-optic frequency divider (EOFD)
Figure 11:
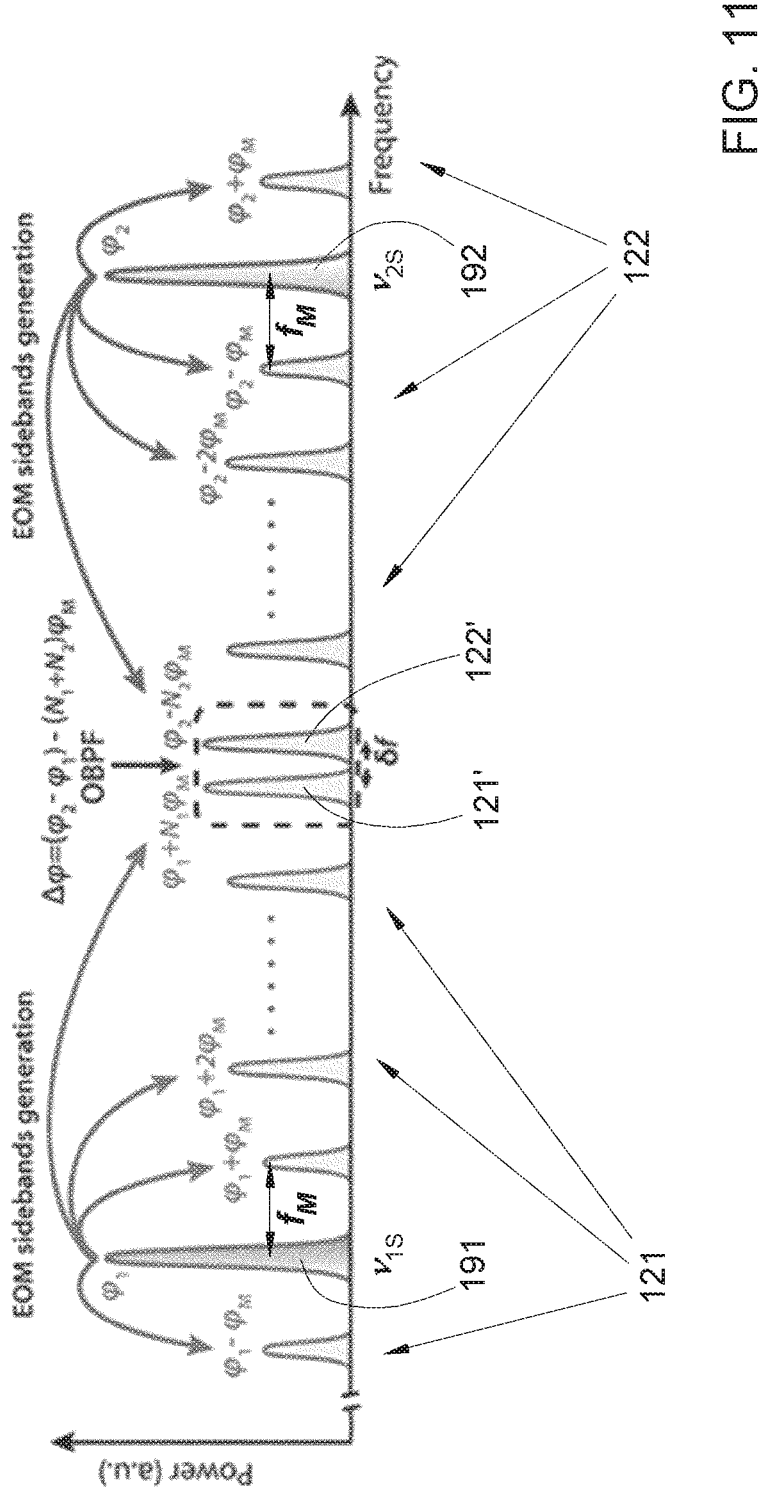
FIG. 11 illustrates schematically optical sideband spectra generated by the example EOFD of FIG. 10.

FIGS. 10 and 11 illustrate schematically an example of an EOFD 200 that can be employed in an inventive microwave-frequency source, and is disclosed in U.S. Pat. Nos. 9,450,673 and 9,537,57. In that example, the EOFD 200 generates (i) from the first optical reference signal 191, a first subset of the multiple sideband optical signals 121 at respective sideband optical frequencies centered at $v_{1S}$ and spaced by $f_M$, and (ii) from the second optical reference signal 192, a second subset of the multiple sideband optical signals 122 at respective sideband optical frequencies centered at $v_{2S}$ and spaced by $f_M$. One sideband optical signal 121' from the first sideband subset 121 and one sideband optical signal 122' from the second sideband subset 122, after passing through an optical bandpass filter 410, are combined on a photodetector 420 to generate the beat electrical signal 299 at the beat frequency $\delta f$.

Figure 13:
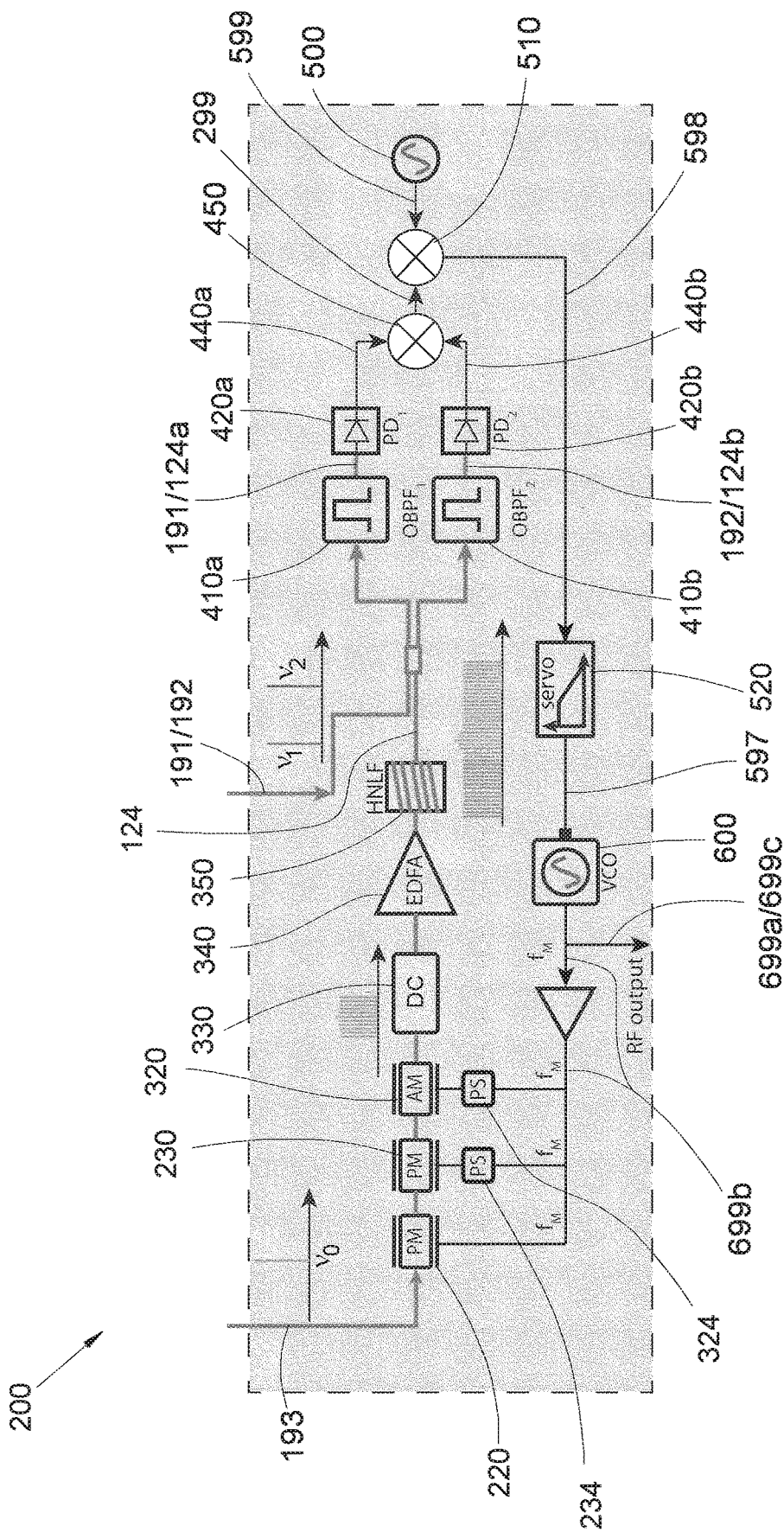
FIG. 13 illustrates schematically another example electro-optic frequency divider (EOFD)
Figure 14:
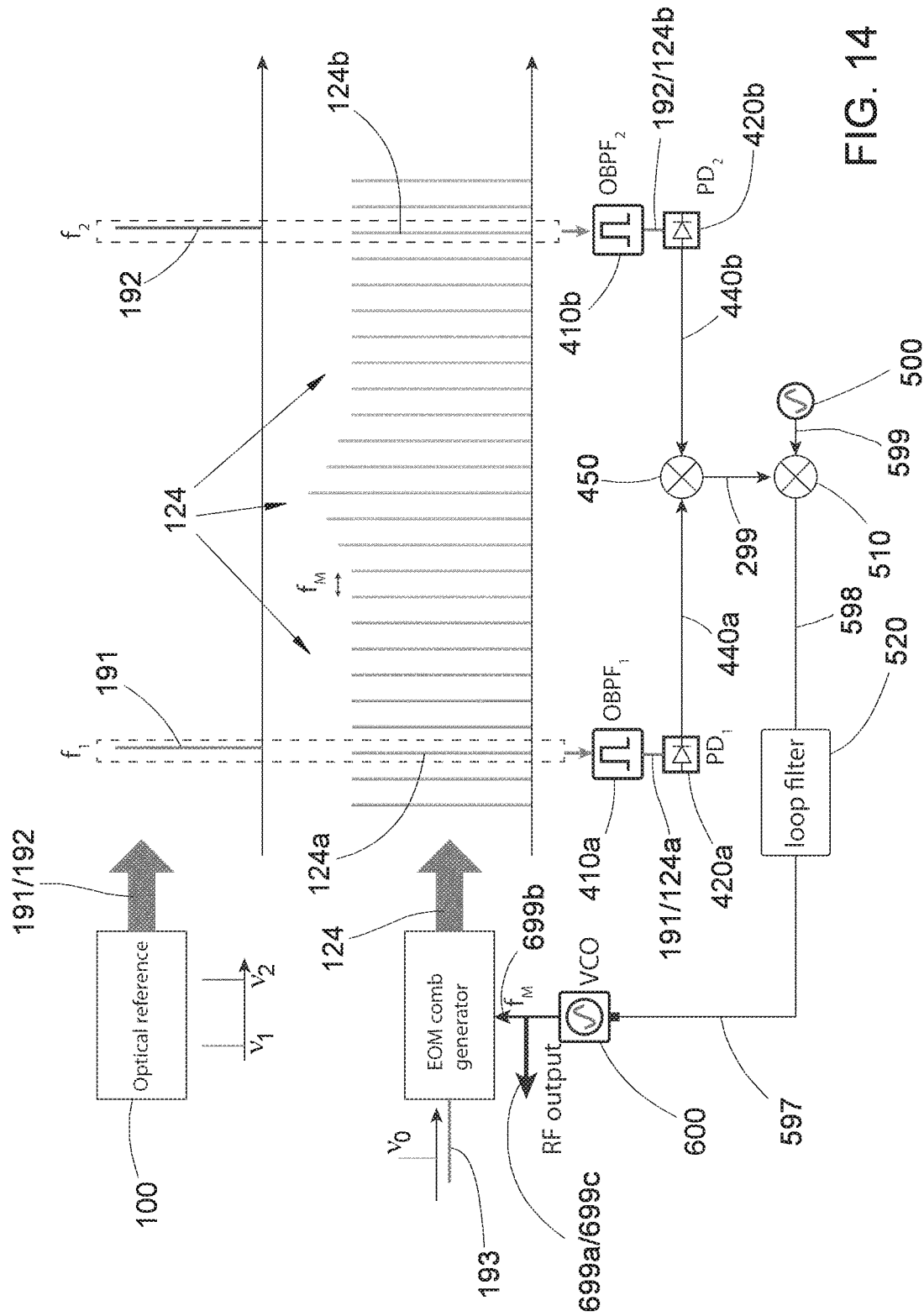
FIG. 14 illustrates schematically optical sideband spectra generated by the example EOFD of FIG. 13.

FIGS. 13 and 14 illustrate schematically an example of an EOFD 200 that can be employed in an inventive microwave-frequency source, and is disclosed in U.S. Pub. No. 2016/0254646. In that example, the EOFD 200 generates, from a sideband-generating optical signal 193 at optical frequency $v_0$, a set of multiple optical sideband signals 124. The optical signal 193 can be a portion of one of the optical signals 191 or 192, or can be one or the pump optical signals from one of the pump sources 130a or 130b (see, e.g., the example DOFRS 100 of FIG. 5), or can be generated by a dedicated optical source employed for that purpose. The first optical reference signal 191 and a first optical sideband 124a among the multiple optical sidebands 124 pass through a first optical bandpass filter 410a, are combined on a first photodetector 420a, and generate a first sideband beat electrical signal 440a. The second optical reference signal 192 and a second optical sideband 124b among the multiple optical sidebands 124 pass through a second optical bandpass filter 410b, are combined on a second photodetector 420b, and generate a second sideband beat electrical signal 440b. A mixer 450 generates from the sideband beat signals 440a/440b the beat electrical signal 299 at the beat frequency $\delta f$.

Each of the EOFD examples described above can include some or all of: one or more phase modulators 220/230, an intensity modulator 320 such as an electro-optic Mach-Zehnder modulator, one or more phase shifters 224/234/324, a dispersion compensator 330, an optical amplifier 340 such as an erbium-doped fiber amplifier, a nonlinear optical medium 350 such as a nonlinear optical fiber. In some examples, the EOFD 200 includes one or more electro-optic phase modulators driven by the second portion 699b of the VCO output electrical signal at the frequency $f_M$. The one or more phase modulators are arranged so as to transmit the first optical reference signal 191, the second optical reference signal 192, or the sideband-generating optical signal 193 to generate the multiple sideband optical signals 121, 122, or 124, respectively. In some examples, the EOFD 200 further includes an intensity modulator 320 driven by the second portion 699b of the VCO output electrical signal at the frequency $f_M$, a dispersion compensator 330, an optical amplifier 340, and a nonlinear optical medium 350. Those elements are arranged in series so as to sequentially, in order, transmit the first optical reference signal 191, the second optical reference signal 192, or the sideband-generating optical signal 193 to generate the multiple sideband optical signals 121, 122, or 124, respectively. In some example EOFDs 200, each set or subset of sideband optical signals 121, 122, or 124 can include at least 10 different sideband optical frequencies, at least 100 different sideband optical frequencies, at least 1000 different sideband optical frequencies, or an even larger number of different sideband optical frequencies.

In some examples of an inventive stabilized microwave-frequency source, the frequency $f_M$ is between about 0.3 GHz and about 300 GHz; in some examples the frequency $f_M$ is between about 1.0 GHz and about 0.10 THz; other suitable frequencies can be employed if needed or desired. In some examples of an inventive stabilized microwave-frequency source, both the first reference frequency $f_{REF1}$ and the beat frequency $\delta f$ are between about 1.0 MHz and about 1.0 GHz; in some examples both the first reference frequency $f_{REF1}$ and the beat frequency $\delta f$ are between about 5 MHz and about 0.5 GHz; in some examples, both the first reference frequency $f_{REF1}$ and the beat frequency $\delta f$ are between about 10. MHz and about 0.10 GHz; other suitable frequencies can be employed if needed or desired. In some examples of an inventive stabilized microwave-frequency source, both the second reference frequency $f_{REF2}$ and the frequency $f_M/m$ are between about 1.0 MHz and about 10. GHz; in some examples, both the second reference frequency $f_{REF2}$ and the frequency $f_M/m$ are between about 5 MHz and about 5 GHz; in some examples, both the second reference frequency $f_{REF2}$ and the frequency $f_M/m$ are between about 10. MHz and about 1.0 GHz; other suitable frequencies can be employed if needed or desired.

In some examples of an inventive stabilized microwave-frequency source, the optical reference difference frequency $v_{2S}-v_{1S}$ is greater than about 0.10 THz; in some examples, the optical reference difference frequency $v_{2S}-v_{1S}$ is greater than about 1.0 THz; in some examples, the optical reference difference frequency $v_{2S}-v_{1S}$ is greater than about 10. THz; in some examples, the optical reference difference frequency $v_{2S}-v_{1S}$ is greater than about 100 THz; other suitable frequencies can be employed if needed or desired. In some examples of an inventive stabilized microwave-frequency source, the first and second optical reference frequencies $v_1$ and $v_2$ are each between about 75 THz and about 750 THz; in some examples, the first and second optical reference frequencies $v_1$ and $v_2$ are each between about 120 THz and about 430 THz; in some examples, the first and second optical reference frequencies $v_1$ and $v_2$ are each between about 150 THz and about 300 THz; other suitable frequencies can be employed if needed or desired. In some examples of an inventive stabilized microwave-frequency source, $(v_{2S}-v_{1S})/f_M$ is greater than or equal to 10, greater than or equal to 50, greater than or equal to 100, greater than or equal to 1000, or even larger.

Figure 12:
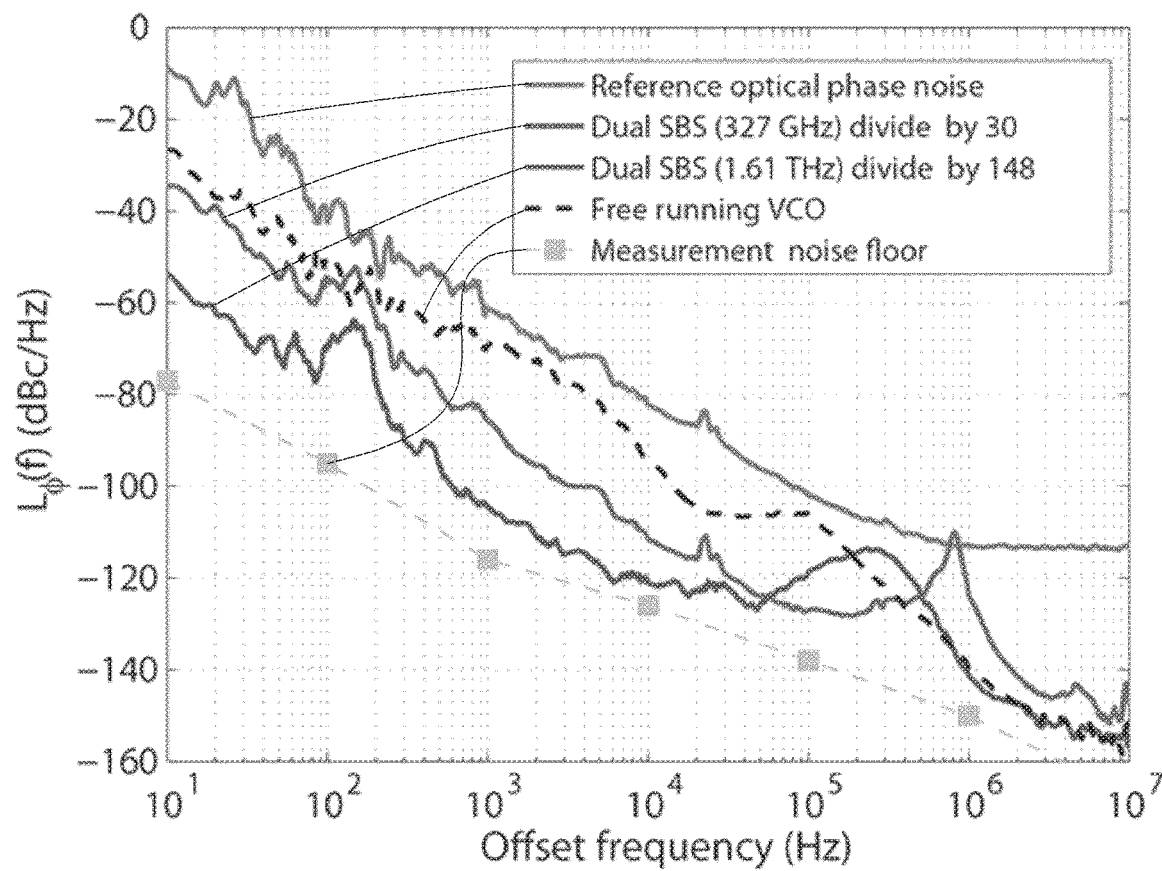
FIG. 12 shows measured noise spectra obtained using the example EOFD of FIG. 10.
Figure 15:
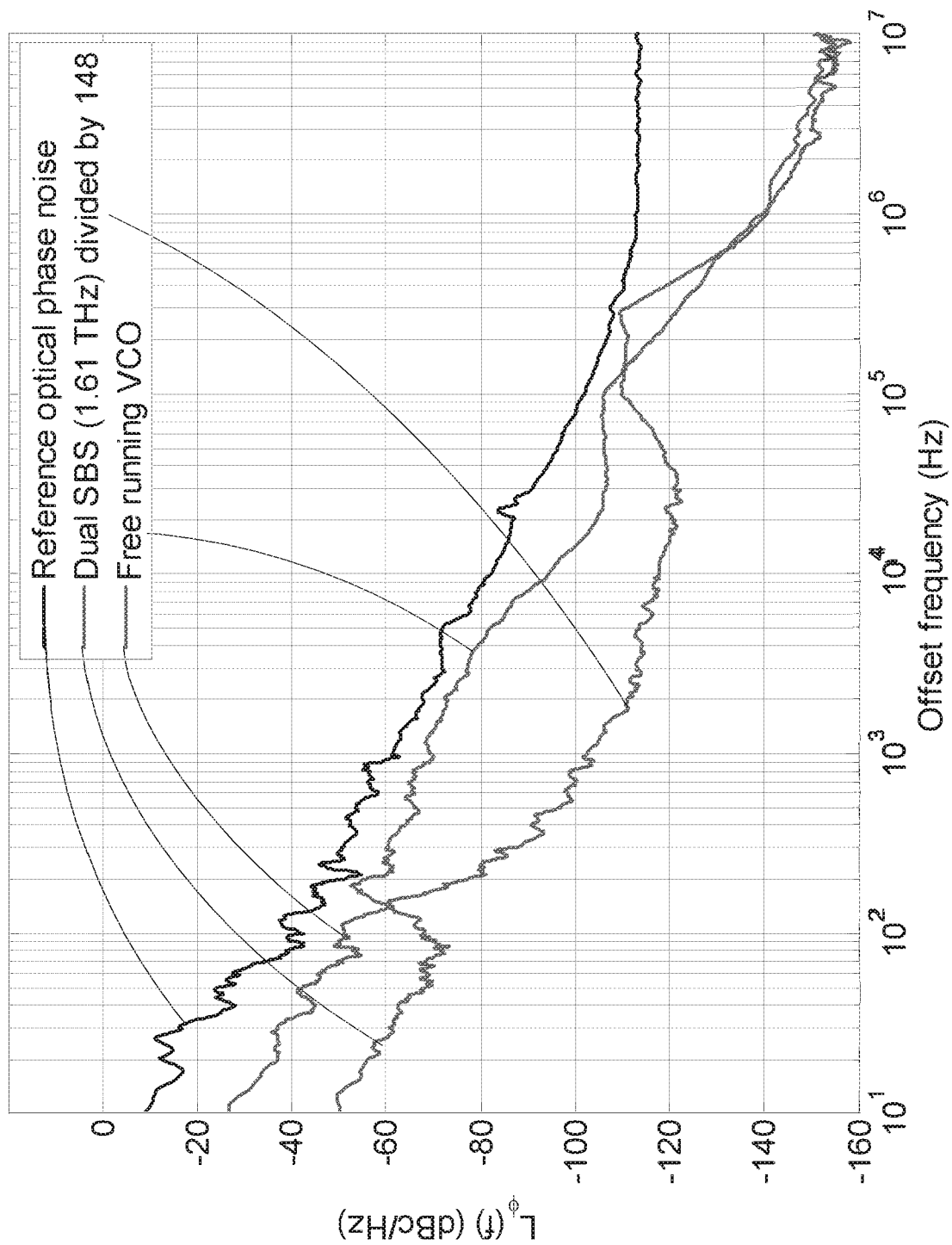
FIG. 15 shows measured noise spectra obtained using the example EOFD of FIG. 13.
Figure 16:
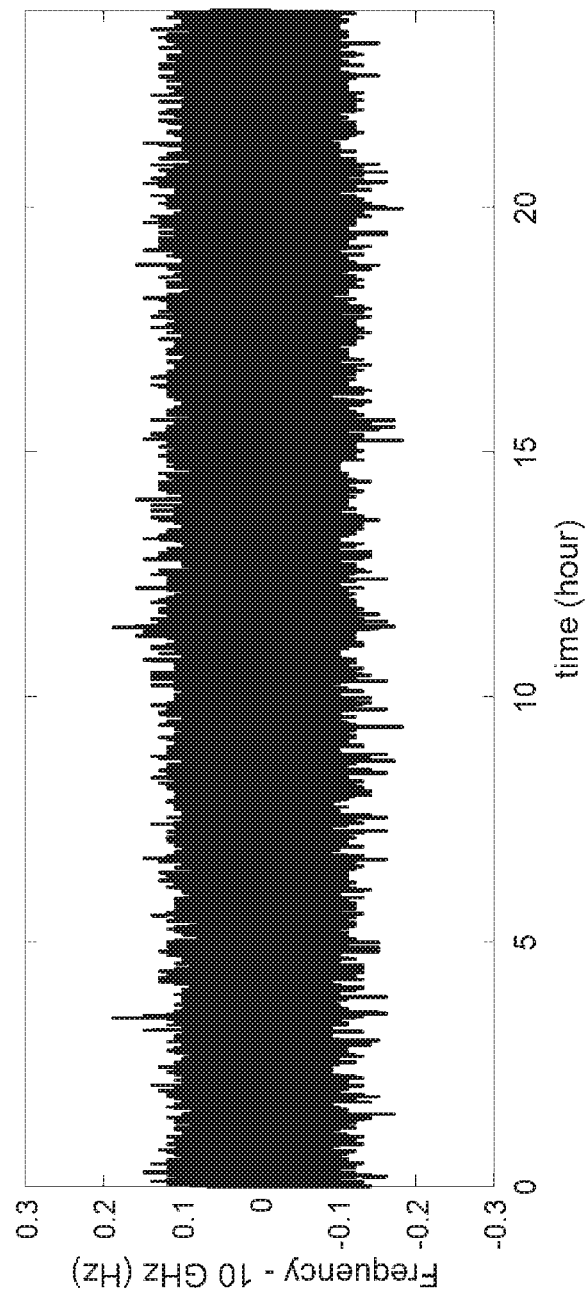
FIG. 16 is a graph of $f_M$ measured over a 24-hour period.

The DOFRS 100 can be operated so as so (i) maintain fluctuations of the optical reference difference frequency $v_{2S}-v_{1S}$ within an operationally acceptable optical reference bandwidth or (ii) maintain phase noise of the optical reference difference frequency signal within an operationally acceptable reference phase noise level. In some examples, the operationally acceptable reference phase noise level is about −40. dBc/Hz at 100 Hz offset frequency and about −80. dBc/Hz at 10 kHz offset frequency; in some examples, the operationally acceptable reference phase noise level is about −80. dBc/Hz at 100 Hz offset frequency and about −125. dBc/Hz at 10 kHz offset frequency. The first and second electrical control circuits can be operated so as so (i) maintain fluctuations of the output frequency $f_M$ within an operationally acceptable output bandwidth or (ii) maintain phase noise of the output electrical signal 699a within an operationally acceptable reference phase noise level. In some examples, the operationally acceptable output bandwidth is less than about 1.0 Hz (i.e., ±0.5 Hz) for time periods greater than about 10. seconds; less than about 1.0 Hz for time periods greater than about 1.0 hour; less than about 0.10 Hz for time periods greater than about 1.0 hour; or less than about 1.0 Hz for time periods greater than about 1.0 day. Examples of noise spectra of the output signal 699a are shown in FIG. 12 (obtained using the EOFD 200 of FIGS. 10 and 11) and in FIG. 15 (obtained using the EOFD 200 of FIGS. 13 and 14). FIG. 16 is a graph of the frequency $f_M$ obtained over a period of 24 hours (employing the arrangement of FIG. 3), and shows a bandwidth less than about 0.5 Hz for fluctuations of the output frequency $f_M$.

In addition to the preceding, the following examples fall within the scope of the present disclosure or appended claims:

Example 1

A microwave-frequency source for generating an output electrical signal at an output frequency $f_M$, the microwave-frequency source comprising: (a) a voltage-controlled electrical oscillator arranged so as to generate a VCO output electrical signal at the frequency $f_M$, a first portion of which forms the output electrical signal of the microwave-frequency source; (b) a dual optical-frequency reference source arranged so as to generate first and second optical reference signals at respective first and second optical reference frequencies $v_{1S}$ and $v_{2S}$, with $v_{2S} > v_{1S}$; (c) an electro-optic frequency divider arranged so as to (i) receive a second portion of the VCO output electrical signal at the frequency $f_M$, (ii) receive the first and second optical reference signals, (iii) generate a set of multiple sideband optical signals at respective sideband optical frequencies spaced by $f_M$, and (iv) generate from two of the sideband optical signals a beat electrical signal at a beat frequency $\delta f$; (d) first and second electrical reference oscillators arranged so as to generate respective first and second reference electrical signals at respective first and second reference frequencies $f_{REF1}$ and $f_{REF2}$; (e) a first electrical control circuit arranged so as to (i) generate a first electrical error signal dependent on relative phase of the beat electrical signal and the first reference electrical signal, and (ii) couple the voltage-controlled oscillator and the electro-optic frequency divider in a negative feedback arrangement, based on the first electrical error signal, that stabilizes the output frequency $f_M$; (f) an electrical frequency divider characterized by a division factor m and arranged so as to receive a third portion of the VCO output electrical signal at the frequency $f_M$, and generate therefrom a divided VCO output electrical signal at a frequency $f_M/m$; and (g) a second electrical control circuit arranged so as to (i) generate a second electrical error signal dependent on relative phase of the divided VCO output electrical signal and the second reference electrical signal, and one or both of (ii) couple the voltage-controlled oscillator and the dual optical-frequency reference source in a negative feedback arrangement, based on the second electrical error signal, that stabilizes an optical reference difference frequency $v_{2S}-v_{1S}$, or (iii) couple the voltage-controlled oscillator and the first electrical reference oscillator in a negative feedback arrangement, based on the second electrical error signal, that alters the first reference frequency $f_{REF1}$ so as to at least partly compensate for fluctuations of the optical reference difference frequency $v_{2S}-v_{1S}$.

Example 2

The microwave-frequency source of Example 1 wherein the first electrical control circuit includes a corresponding comparator portion arranged so as to generate the first electrical error signal and a corresponding loop filter portion arranged so as to process the first electrical error signal, and the voltage-controlled oscillator and the electro-optic frequency divider are coupled by the first electrical control circuit so as to function as a phase-locked loop.

Example 3

The microwave-frequency source of any one of Examples 1 or 2 wherein the second electrical control circuit arranged so as to couple the voltage-controlled oscillator and both the dual optical-frequency reference source and the first electrical reference oscillator in the negative feedback arrangement, based on the second electrical error signal, that stabilizes the optical reference difference frequency $v_{2S}-v_{1S}$ and alters the first reference frequency $f_{REF1}$ so as to at least partly compensate for fluctuations of the optical reference difference frequency $v_{2S}-v_{1S}$.

Example 4

The microwave-frequency source of any one of Examples 1 through 3 wherein the second electrical control circuit arranged so as to couple the voltage-controlled oscillator and the first electrical reference oscillator in the negative feedback arrangement, based on the second electrical error signal, that alters the first reference frequency $f_{REF1}$ so as to at least partly compensate for fluctuations of the optical reference difference frequency $v_{2S}-v_{1S}$.

Example 5

The microwave-frequency source of Example 4 wherein the second electrical control circuit includes a corresponding comparator portion arranged so as to generate the second electrical error signal and a corresponding loop filter portion arranged so as to process the second electrical error signal, and the voltage-controlled oscillator and the first electrical reference oscillator are coupled by the second electrical control circuit so as to function as a phase-locked loop.

Example 6

The microwave-frequency source of any one of Examples 4 or 5 wherein the first electrical reference oscillator includes a tunable electronic oscillator, and the second electrical control circuit is connected to the tunable electronic oscillator so as to enable tuning of the first reference frequency $f_{REF1}$.

Example 7

The microwave-frequency source of any one of Examples 1 through 6 wherein the second electrical control circuit is arranged so as to couple the voltage-controlled oscillator and the dual optical-frequency reference source in the negative feedback arrangement, based on the second electrical error signal, that stabilizes the optical reference difference frequency $v_{2S}-v_{1S}$.

Example 8

The microwave-frequency source of Example 7 wherein the second electrical control circuit includes a corresponding comparator portion arranged so as to generate the second electrical error signal and a corresponding loop filter portion arranged so as to process the second electrical error signal, and the voltage-controlled oscillator and the dual optical-frequency reference source are coupled by the second electrical control circuit so as to function as a phase-locked loop.

Example 9

The microwave-frequency source of any one of Examples 7 or 8 wherein (i) the dual optical-frequency reference source includes an optical resonator, (ii) one or both of the first or second optical reference frequencies $v_{1S}$ or $v_{2S}$ are resonant in corresponding resonant optical modes of the optical resonator, and (iii) the second electrical control circuit is arranged so as to alter corresponding optical frequencies of resonant optical modes of the resonator, thereby altering the optical reference difference frequency $v_{2S}-v_{1S}$.

Example 10

The microwave-frequency source of Example 9 wherein (i) the dual optical-frequency reference source includes first and second pump laser sources and the optical resonator is characterized by a Brillouin shift frequency $v_B$, (ii) one or both of the first and second pump laser sources is frequency-locked at one or both corresponding first and second pump optical frequencies $v_1$ and $v_2$ to corresponding resonant optical modes of the optical resonator, (iii) the first and second optical reference signals at the first and second optical reference frequencies $v_{1S}$ and $v_{2S}$ comprise stimulated Brillouin laser output generated by optical pumping of the optical resonator simultaneously by the first and second pump laser sources, with $v_1-v_{1S}$ and $v_2-v_{2S}$ each being substantially equal to $v_B$ or an integer multiple thereof, and (iv) the first and second optical reference frequencies $v_{1S}$ and $v_{2S}$ are resonant in corresponding resonant optical modes of the optical resonator.

Example 11

The microwave-frequency source of Example 10 wherein free spectral range of the optical resonator is substantially equal to the Brillouin shift frequency of the optical resonator, or an integer submultiple thereof.

Example 12

The microwave-frequency source of any one of Examples 10 or 11 wherein the optical resonator comprises silica and the Brillouin shift frequency of the optical resonator is about 10.9 GHz.

Example 13

The microwave-frequency source of any one of Examples 9 through 12 wherein each one of the first and second pump laser sources is frequency-locked to the corresponding resonant optical mode of the optical resonator by a Pound-Drever-Hall mechanism.

Example 14

The microwave-frequency source of any one of Examples 9 through 13 wherein the optical resonator comprises a ring optical resonator or a disk optical resonator, and the second electrical control circuit is connected to a temperature control element arranged so as to enable temperature tuning of the optical reference difference frequency $v_{2S}-v_{1S}$.

Example 15

The microwave-frequency source of any one of Examples 9 through 13 wherein the optical resonator comprises a ring optical resonator or a disk optical resonator incorporating at least one electro-optic material, and the second electrical control circuit is connected to an electrode arranged so as to enable electro-optic tuning of the optical reference difference frequency $v_{2S}-v_{1S}$.

Example 16

The microwave-frequency source of any one of Examples 9 through 13 wherein the optical resonator comprises a ring optical resonator or a disk optical resonator incorporating at least one photoelastic material, and the second electrical control circuit is connected to a mechanical actuator arranged so as to enable stress-optic tuning of the optical reference difference frequency $v_{2S}-v_{1S}$.

Example 17

The microwave-frequency source of any one of Examples 9 through 13 wherein the optical resonator comprises a fiber optical resonator, and the second electrical control circuit is connected to a fiber stretcher arranged so as to enable tuning of the optical reference difference frequency $v_{2S}-v_{1S}$ by altering length of the fiber optical resonator.

Example 18

The microwave-frequency source of Example 17 wherein the optical resonator comprises a fiber Fabry-Perot optical resonator.

Example 19

The microwave-frequency source of Example 17 wherein the fiber optical resonator comprises a fiber-loop optical resonator.

Example 20

The microwave-frequency source of Example 19 wherein the optical resonator is arranged so as to support resonant optical modes propagating in both directions.

Example 21

The microwave-frequency source of Example 19 wherein the optical resonator is arranged so as to support resonant optical modes propagating in only one direction.

Example 22

The microwave-frequency source of any one of Examples 9 through 21 wherein the dual optical-frequency reference source comprises first and second reference laser sources operating at the first and second optical reference frequencies $v_{1S}$ and $v_{2S}$, respectively, and the first and second laser sources are each frequency-locked to a corresponding resonant optical mode of the optical resonator.

Example 23

The microwave-frequency source of Example 22 wherein one or both of the first or second optical reference frequencies $v_{1S}$ or $v_{2S}$ are frequency-locked to the corresponding resonant optical mode of the optical resonator by a Pound-Drever-Hall mechanism.

Example 24

The microwave-frequency source of any one of Examples 9 through 23 wherein the dual optical-frequency reference source comprises a dual-mode laser source.

Example 25

The microwave-frequency source of any one of Examples 1 through 24 wherein the electro-optic frequency divider is arranged so as to (i) generate from the first optical reference signal a first subset of the multiple sideband optical signals at respective sideband optical frequencies centered at $v_{1S}$ and spaced by $f_M$, (ii) generate from the second optical reference signal a second subset of the multiple sideband optical signals at respective sideband optical frequencies centered at $v_{2S}$ and spaced by $f_M$, and (iii) combine on a photodetector one sideband of each subset so as to generate the beat electrical signal at the beat frequency $\delta f$.

Example 26

The microwave-frequency source of any one of Examples 1 through 24 wherein the electro-optic frequency divider is arranged so as to (i) combine on a first photodetector the first optical reference signal and a first one of the multiple sidebands so as to generate a first sideband beat electrical signal, (ii) combine on a second photodetector the second optical reference signal and a second one of the multiple sidebands so as to generate a second sideband beat electrical signal, and (ii) mix electrically the first and second sideband beat electrical signals so as to generate the beat electrical signal at the beat frequency $\delta f$.

Example 27

The microwave-frequency source of any one of Examples 1 through 26 wherein (i) the electro-optic frequency divider includes one or more electro-optic phase modulators driven by the second portion of the VCO output electrical signal at the frequency $f_M$, and (ii) the one or more phase modulators are arranged so as to transmit the first optical reference signal, the second optical reference signal, or a sideband-generating optical signal so as to generate the multiple sideband optical signals.

Example 28

The microwave-frequency source of Example 27 wherein (i) the electro-optic frequency divider further includes an intensity modulator driven by the second portion of the VCO output electrical signal at the frequency $f_M$, a dispersion compensator, an optical amplifier, and a nonlinear optical medium, and (ii) the one or more phase modulators, the intensity modulator, the dispersion compensator, the optical amplifier, and the nonlinear optical medium are arranged in series so as to sequentially, in order, transmit the first optical reference signal, the second optical reference signal, or the sideband-generating optical signal so as to generate the multiple sideband optical signals.

Example 29

The microwave-frequency source of Example 28 wherein (i) the intensity modulator comprises an electro-optic Mach-Zehnder modulator, (ii) the dispersion compensator comprises a suitably dispersive optical fiber, (iii) the optical amplifier comprises a doped optical fiber amplifier, and (iv) the nonlinear optical medium comprises a nonlinear optical fiber.

Example 30

The microwave-frequency source of any one of Examples 1 through 29 wherein the set of sideband optical signals includes at least 10 different sideband optical frequencies.

Example 31

The microwave-frequency source of any one of Examples 1 through 29 wherein the set of sideband optical signals includes at least 100 different sideband optical frequencies.

Example 32

The microwave-frequency source of any one of Examples 1 through 29 wherein the set of sideband optical signals includes at least 1000 different sideband optical frequencies.

Example 33

The microwave-frequency source of any one of Examples 1 through 32 wherein the frequency $f_M$ is between about 0.3 GHz and about 300 GHz.

Example 34

The microwave-frequency source of any one of Examples 1 through 32 wherein the frequency $f_M$ is between about 1.0 GHz and about 0.10 THz.

Example 35

The microwave-frequency source of any one of Examples 1 through 34 wherein both the first reference frequency $f_{REF1}$ and the beat frequency $\delta f$ are between about 1.0 MHz and about 1.0 GHz.

Example 36

The microwave-frequency source of any one of Examples 1 through 34 wherein both the first reference frequency $f_{REF1}$ and the beat frequency $\delta f$ are between about 5 MHz and about 0.5 GHz.

Example 37

The microwave-frequency source of any one of Examples 1 through 34 wherein both the first reference frequency $f_{REF1}$ and the beat frequency $\delta f$ are between about 10. MHz and about 0.10 GHz.

Example 38

The microwave-frequency source of any one of Examples 1 through 37 wherein both the second reference frequency $f_{REF2}$ and the frequency $f_M/m$ are between about 1.0 MHz and about 10. GHz.

Example 39

The microwave-frequency source of any one of Examples 1 through 37 wherein both the second reference frequency $f_{REF2}$ and the frequency $f_M/m$ are between about 5 MHz and about 5 GHz.

Example 40

The microwave-frequency source of any one of Examples 1 through 37 wherein both the second reference frequency $f_{REF2}$ and the frequency $f_M/m$ are between about 10. MHz and about 1.0 GHz.

Example 41

The microwave-frequency source of any one of Examples 1 through 40 wherein the optical reference difference frequency $v_{2S}-v_{1S}$ is greater than about 0.10 THz.

Example 42

The microwave-frequency source of any one of Examples 1 through 40 wherein the optical reference difference frequency $v_{2S}-v_{1S}$ is greater than about 1.0 THz.

Example 43

The microwave-frequency source of any one of Examples 1 through 40 wherein the optical reference difference frequency $v_{2S}-v_{1S}$ is greater than about 10. THz.

Example 44

The microwave-frequency source of any one of Examples 1 through 40 wherein the optical reference difference frequency $v_{2S}-v_{1S}$ is greater than about 100 THz.

Example 45

The microwave-frequency source of any one of Examples 1 through 44 wherein phase noise of the output electrical signal of the microwave-frequency source is reduced by a factor of approximately $((v_{2S}-v_{1S})/f_M)^2$ relative to phase noise of an optical reference difference frequency signal at the optical reference difference frequency $v_{2S}-v_{1S}$ of the dual optical-frequency reference source.

Example 46

The microwave-frequency source of any one of Examples 1 through 45 wherein $(v_{2S}-v_{1S})/f_M$ is greater than or equal to 10.

Example 47

The microwave-frequency source of any one of Examples 1 through 45 wherein $(v_{2S}-v_{1S})/f_M$ is greater than or equal to 50.

Example 48

The microwave-frequency source of any one of Examples 1 through 45 wherein $(v_{2S}-v_{1S})/f_M$ is greater than or equal to 100.

Example 49

The microwave-frequency source of any one of Examples 1 through 45 wherein $(v_{2S}-v_{1S})/f_M$ is greater than or equal to 1000.

Example 50

The microwave-frequency source of any one of Examples 1 through 49 wherein the first and second optical reference frequencies $v_1$ and $v_2$ are each between about 75 THz and about 750 THz.

Example 51

The microwave-frequency source of any one of Examples 1 through 49 wherein the first and second optical reference frequencies $v_1$ and $v_2$ are each between about 120 THz and about 430 THz.

Example 52

The microwave-frequency source of any one of Examples 1 through 49 wherein the first and second optical reference frequencies $v_1$ and $v_2$ are each between about 150 THz and about 300 THz.

Example 53

The microwave-frequency source of any one of Examples 1 through 52 wherein the output frequency $f_M$ is stabilized so as to (i) maintain fluctuations of the output frequency $f_M$ within an operationally acceptable output bandwidth or (ii) maintain phase noise of the output electrical signal within an operationally acceptable reference phase noise level.

Example 54

The microwave-frequency source of Example 53 wherein the operationally acceptable reference bandwidth is less than about 1.0 Hz for time periods greater than about 10. seconds.

Example 55

The microwave-frequency source of any one of Examples 53 or 54 wherein the operationally acceptable reference bandwidth is less than about 1.0 Hz for time periods greater than about 1.0 hour.

Example 56

The microwave-frequency source of any one of Examples 53 through 55 wherein the operationally acceptable reference bandwidth is less than about 0.10 Hz for time periods greater than about 1.0 hour.

Example 57

The microwave-frequency source of any one of Examples 53 through 56 wherein the operationally acceptable reference bandwidth is less than about 1.0 Hz for time periods greater than about 1.0 day.

Example 58

The microwave-frequency source of any one of Examples 1 through 57 wherein the dual optical-frequency reference source is stabilized so as to (i) maintain fluctuations of the optical reference difference frequency $v_{2S}-v_{1S}$ within an operationally acceptable output bandwidth or (ii) maintain phase noise of the optical reference difference frequency signal within an operationally acceptable reference phase noise level.

Example 59

The microwave-frequency source of Example 58 wherein the operationally acceptable reference phase noise level is about −40. dBc/Hz at 100 Hz offset frequency and about −80. dBc/Hz at 10 kHz offset frequency.

Example 60

The microwave-frequency source of Example 58 wherein the operationally acceptable reference phase noise level is about −80. dBc/Hz at 100 Hz offset frequency and about −125. dBc/Hz at 10 kHz offset frequency.

Example 61

A method for generating a microwave-frequency output electrical signal at an output frequency $f_M$, using the microwave-frequency source of any one of Examples 1 through 60, the method comprising: (a) using a voltage-controlled electrical oscillator, generating a VCO output electrical signal at the frequency $f_M$, a first portion of which forms the output electrical signal of the microwave-frequency source; (b) using a dual optical-frequency reference source, generating first and second optical reference signals at respective first and second optical reference frequencies $v_{1S}$ and $v_{2S}$, with $v_{2S} > v_{1S}$; (c) using an electro-optic frequency divider, (i) receiving a second portion of the VCO output electrical signal at the frequency $f_M$, (ii) receiving the first and second optical reference signals, (iii) generating a set of multiple sideband optical signals at respective sideband optical frequencies spaced by $f_M$, and (iv) generating from two of the sideband optical signals a beat electrical signal at a beat frequency $\delta f$; (d) using first and second electrical reference oscillators, generating respective first and second reference electrical signals at respective first and second reference frequencies $f_{REF1}$ and $f_{REF2}$; (e) using a first electrical control circuit, (i) generating a first electrical error signal dependent on relative phase of the beat electrical signal and the first reference electrical signal, and (ii) coupling the voltage-controlled oscillator and the electro-optic frequency divider in a negative feedback arrangement, based on the first electrical error signal, thereby stabilizing the output frequency $f_M$; (f) using an electrical frequency divider characterized by a division factor m, receiving a third portion of the VCO output electrical signal at the frequency $f_M$, and generating therefrom a divided VCO output electrical signal at a frequency $f_M/m$; and (g) using a second electrical control circuit, (i) generating a second electrical error signal dependent on relative phase of the divided VCO output electrical signal and the second reference electrical signal, and one or both of (ii) coupling the voltage-controlled oscillator and the dual optical-frequency reference source in a negative feedback arrangement, based on the second electrical error signal, thereby stabilizing an optical reference difference frequency $v_{2S}-v_{1S}$, or (iii) coupling the voltage-controlled oscillator and the first electrical reference oscillator in a negative feedback arrangement, based on the second electrical error signal, thereby altering the first reference frequency $f_{REF1}$ so as to at least partly compensate for fluctuations of the optical reference difference frequency $v_{2S}-v_{1S}$.

It is intended that equivalents of the disclosed example embodiments and methods shall fall within the scope of the present disclosure or appended claims. It is intended that the disclosed example embodiments and methods, and equivalents thereof, may be modified while remaining within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore the present disclosure shall be construed as implicitly disclosing any embodiment having any suitable set of one or more features—which features are shown, described, or claimed in the present application—including those sets that may not be explicitly disclosed herein. A "suitable" set of features includes only features that are neither incompatible nor mutually exclusive with respect to any other feature of the set. Accordingly, the appended claims are hereby incorporated into the Detailed Description, with each claim standing on its own as a separate disclosed embodiment. In addition, only for purposes of disclosure by said incorporation of the claims into the Detailed Description, each of the appended dependent claims shall be interpreted as if written in multiple dependent form and dependent upon all preceding claims with which it is not inconsistent. It should be further noted that the scope of the appended claims can, but does not necessarily, encompass the whole of the subject matter disclosed in the present application.

For purposes of the present disclosure and appended claims, the conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives. For purposes of the present disclosure and appended claims, the words "comprising," "including," "having," and variants thereof, wherever they appear, shall be construed as open ended terminology, with the same meaning as if the phrase "at least" were appended after each instance thereof, unless explicitly stated otherwise. For purposes of the present disclosure or appended claims, when terms are employed such as "about equal to," "substantially equal to," "greater than about," "less than about," and so forth, in relation to a numerical quantity, standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A microwave-frequency source for generating an output electrical signal at an output frequency $f_M$, the microwave-frequency source comprising:
    (a) a voltage-controlled electrical oscillator arranged so as to generate a VCO output electrical signal at the frequency $f_M$, a first portion of which forms the output electrical signal of the microwave-frequency source;

(b) a dual optical-frequency reference source arranged so as to generate first and second optical reference signals at respective first and second optical reference frequencies $v_{1S}$ and $v_{2S}$, with $v_{2S} > v_{1S}$;

(c) an electro-optic frequency divider arranged so as to (i) receive a second portion of the VCO output electrical signal at the frequency $f_M$, (ii) receive the first and second optical reference signals, (iii) generate a set of multiple sideband optical signals at respective sideband optical frequencies spaced by $f_M$, and (iv) generate from two of the sideband optical signals a beat electrical signal at a beat frequency $\delta f$;

(d) first and second electrical reference oscillators arranged so as to generate respective first and second reference electrical signals at respective first and second reference frequencies $f_{REF1}$ and $f_{REF2}$;

(e) a first electrical control circuit arranged so as to (i) generate a first electrical error signal dependent on relative phase of the beat electrical signal and the first reference electrical signal, and (ii) couple the voltage-controlled oscillator and the electro-optic frequency divider in a negative feedback arrangement, based on the first electrical error signal, that stabilizes the output frequency $f_M$;

(f) an electrical frequency divider characterized by a division factor m and arranged so as to receive a third portion of the VCO output electrical signal at the frequency $f_M$, and generate therefrom a divided VCO output electrical signal at a frequency $f_M/m$; and (g) a second electrical control circuit arranged so as to (i) generate a second electrical error signal dependent on relative phase of the divided VCO output electrical signal and the second reference electrical signal, and one or both of (ii) couple the voltage-controlled oscillator and the dual optical-frequency reference source in a negative feedback arrangement, based on the second electrical error signal, that stabilizes an optical reference difference frequency $v_{2S} - v_{1S}$, or (iii) couple the voltage-controlled oscillator and the first electrical reference oscillator in a negative feedback arrangement, based on the second electrical error signal, that alters the first reference frequency $f_{REF1}$ so as to at least partly compensate for fluctuations of the optical reference difference frequency $v_{2S} - v_{1S}$.

2. The microwave-frequency source of claim 1 wherein the second electrical control circuit arranged so as to couple the voltage-controlled oscillator and the first electrical reference oscillator in the negative feedback arrangement, based on the second electrical error signal, that alters the first reference frequency $f_{REF1}$ so as to at least partly compensate for fluctuations of the optical reference difference frequency $v_{2S} - v_{1S}$.

3. The microwave-frequency source of claim 2 wherein the second electrical control circuit includes a corresponding comparator portion arranged so as to generate the second electrical error signal and a corresponding loop filter portion arranged so as to process the second electrical error signal, and the voltage-controlled oscillator and the first electrical reference oscillator are coupled by the second electrical control circuit so as to function as a phase-locked loop.

4. The microwave-frequency source of claim 1 wherein the second electrical control circuit is arranged so as to couple the voltage-controlled oscillator and the dual optical-frequency reference source in the negative feedback arrangement, based on the second electrical error signal, that stabilizes the optical reference difference frequency $v_{2S} - v_{1S}$.

5. The microwave-frequency source of claim 4 wherein the second electrical control circuit includes a corresponding comparator portion arranged so as to generate the second electrical error signal and a corresponding loop filter portion arranged so as to process the second electrical error signal, and the voltage-controlled oscillator and the dual optical-frequency reference source are coupled by the second electrical control circuit so as to function as a phase-locked loop.

6. The microwave-frequency source of claim 4 wherein (i) the dual optical-frequency reference source includes an optical resonator, (ii) one or both of the first or second optical reference frequencies $v_{1S}$ or $v_{2S}$ are resonant in corresponding resonant optical modes of the optical resonator, and (iii) the second electrical control circuit is arranged so as to alter corresponding optical frequencies of resonant optical modes of the resonator, thereby altering the optical reference difference frequency $v_{2S} - v_{1S}$.

7. The microwave-frequency source of claim 6 wherein (i) the dual optical-frequency reference source includes first and second pump laser sources and the optical resonator is characterized by a Brillouin shift frequency $v_B$, (ii) one or both of the first and second pump laser sources is frequency-locked at one or both corresponding first and second pump optical frequencies $v_1$ and $v_2$ to corresponding resonant optical modes of the optical resonator, (iii) the first and second optical reference signals at the first and second optical reference frequencies $v_{1S}$ and $v_{2S}$ comprise stimulated Brillouin laser output generated by optical pumping of the optical resonator simultaneously by the first and second pump laser sources, with $v_1 - v_{1S}$ and $v_2 - v_{2S}$ each being substantially equal to $v_B$ or an integer multiple thereof, and (iv) the first and second optical reference frequencies $v_{1S}$ and $v_{2S}$ are resonant in corresponding resonant optical modes of the optical resonator.

8. The microwave-frequency source of claim 6 wherein the optical resonator comprises a fiber optical resonator, and the second electrical control circuit is connected to a fiber stretcher arranged so as to enable tuning of the optical reference difference frequency $v_{2S} - v_{1S}$ by altering length of the fiber optical resonator.

9. The microwave-frequency source of claim 8 wherein the fiber optical resonator comprises a fiber-loop optical resonator.

10. The microwave-frequency source of claim 9 wherein the optical resonator is arranged so as to support resonant optical modes propagating in both directions.

11. The microwave-frequency source of claim 9 wherein the optical resonator is arranged so as to support resonant optical modes propagating in only one direction.

12. The microwave-frequency source of claim 1 wherein the electro-optic frequency divider is arranged so as to (i) generate from the first optical reference signal a first subset of the multiple sideband optical signals at respective sideband optical frequencies centered at $v_{1S}$ and spaced by $f_M$, (ii) generate from the second optical reference signal a second subset of the multiple sideband optical signals at respective sideband optical frequencies centered at $v_{2S}$ and spaced by $f_M$, and (iii) combine on a photodetector one sideband of each subset so as to generate the beat electrical signal at the beat frequency $\delta f$.

13. The microwave-frequency source of claim 1 wherein the electro-optic frequency divider is arranged so as to (i) combine on a first photodetector the first optical reference signal and a first one of the multiple sidebands so as to generate a first sideband beat electrical signal, (ii) combine on a second photodetector the second optical reference signal and a second one of the multiple sidebands so as to generate a second sideband beat electrical signal, and (ii) mix electrically the first and second sideband beat electrical signals so as to generate the beat electrical signal at the beat frequency $\delta f$.

14. The microwave-frequency source of claim 1 wherein (i) the electro-optic frequency divider includes one or more electro-optic phase modulators driven by the second portion of the VCO output electrical signal at the frequency $f_M$, and (ii) the one or more phase modulators are arranged so as to transmit the first optical reference signal, the second optical reference signal, or a sideband-generating optical signal so as to generate the multiple sideband optical signals.

15. The microwave-frequency source of claim 14 wherein (i) the electro-optic frequency divider further includes an intensity modulator driven by the second portion of the VCO output electrical signal at the frequency $f_M$, a dispersion compensator, an optical amplifier, and a nonlinear optical medium, and (ii) the one or more phase modulators, the intensity modulator, the dispersion compensator, the optical amplifier, and the nonlinear optical medium are arranged in series so as to sequentially, in order, transmit the first optical reference signal, the second optical reference signal, or the sideband-generating optical signal so as to generate the multiple sideband optical signals.

16. The microwave-frequency source of claim 1 wherein the set of sideband optical signals includes at least 10 different sideband optical frequencies.

17. The microwave-frequency source of claim 1 wherein the set of sideband optical signals includes at least 100 different sideband optical frequencies.

18. The microwave-frequency source of claim 1 wherein the frequency $f_M$ is between about 0.3 GHz and about 300 GHz.

19. The microwave-frequency source of claim 1 wherein both the first reference frequency $f_{REF1}$ and the beat frequency $\delta f$ are between about 1.0 MHz and about 1.0 GHz.

20. The microwave-frequency source of claim 1 wherein both the second reference frequency $f_{REF2}$ and the frequency $f_M/m$ are between about 1.0 MHz and about 10.0 GHz.

21. The microwave-frequency source of claim 1 wherein the optical reference difference frequency $v_{2S}-v_{1S}$ is greater than about 0.10 THz.

22. The microwave-frequency source of claim 1 wherein the optical reference difference frequency $v_{2S}-v_{1S}$ is greater than about 1.0 THz.

23. The microwave-frequency source of claim 1 wherein phase noise of the output electrical signal of the microwave-frequency source is reduced by a factor of approximately $((v_{2S}-v_{1S})/f_M)^2$ relative to phase noise of an optical reference difference frequency signal at the optical reference difference frequency $v_{2S}-v_{1S}$ of the dual optical-frequency reference source.

24. The microwave-frequency source of claim 1 wherein $(v_{2S}-v_{1S})/f_M$ is greater than or equal to 10.

25. The microwave-frequency source of claim 1 wherein $(v_{2S}-v_{1S})/f_M$ is greater than or equal to 50.

26. The microwave-frequency source of claim 1 wherein the first and second optical reference frequencies $v_1$ and $v_2$ are each between about 75 THz and about 750 THz.

27. The microwave-frequency source of claim 1 wherein the output frequency $f_M$ is stabilized so as to (i) maintain fluctuations of the output frequency $f_M$ within an operationally acceptable output bandwidth or (ii) maintain phase noise of the output electrical signal within an operationally acceptable reference phase noise level.

28. The microwave-frequency source of claim 27 wherein the operationally acceptable reference bandwidth is less than about 1.0 Hz for time periods greater than about 10. seconds.

29. The microwave-frequency source of claim 27 wherein the operationally acceptable reference bandwidth is less than about 1.0 Hz for time periods greater than about 1.0 hour.

30. The microwave-frequency source of claim 1 wherein the dual optical-frequency reference source is stabilized so as to (i) maintain fluctuations of the optical reference difference frequency $v_{2S}-v_{1S}$ within an operationally acceptable output bandwidth or (ii) maintain phase noise of the optical reference difference frequency signal within an operationally acceptable reference phase noise level.

31. A method for generating a microwave-frequency output electrical signal at an output frequency $f_M$, the method comprising:
(a) using a voltage-controlled electrical oscillator, generating a VCO output electrical signal at the frequency $f_M$, a first portion of which forms the output electrical signal of the microwave-frequency source;
(b) using a dual optical-frequency reference source, generating first and second optical reference signals at respective first and second optical reference frequencies $v_{1S}$ and $v_{2S}$, with $v_{2S} > v_{1S}$;
(c) using an electro-optic frequency divider, (i) receiving a second portion of the VCO output electrical signal at the frequency $f_M$, (ii) receiving the first and second optical reference signals, (iii) generating a set of multiple sideband optical signals at respective sideband optical frequencies spaced by $f_M$, and (iv) generating from two of the sideband optical signals a beat electrical signal at a beat frequency $\delta f$;
(d) using first and second electrical reference oscillators, generating respective first and second reference electrical signals at respective first and second reference frequencies $f_{REF1}$ and $f_{REF2}$;
(e) using a first electrical control circuit, (i) generating a first electrical error signal dependent on relative phase of the beat electrical signal and the first reference electrical signal, and (ii) coupling the voltage-controlled oscillator and the electro-optic frequency divider in a negative feedback arrangement, based on the first electrical error signal, thereby stabilizing the output frequency $f_M$;
(f) using an electrical frequency divider characterized by a division factor m, receiving a third portion of the VCO output electrical signal at the frequency $f_M$, and generating therefrom a divided VCO output electrical signal at a frequency $f_M/m$; and
(g) using a second electrical control circuit, (i) generating a second electrical error signal dependent on relative phase of the divided VCO output electrical signal and the second reference electrical signal, and one or both of (ii) coupling the voltage-controlled oscillator and the dual optical-frequency reference source in a negative feedback arrangement, based on the second electrical error signal, thereby stabilizing an optical reference difference frequency $v_{2S}-v_{1S}$, or (iii) coupling the voltage-controlled oscillator and the first electrical reference oscillator in a negative feedback arrangement, based on the second electrical error signal, thereby altering the first reference frequency $f_{REF1}$ so as to at least partly compensate for fluctuations of the optical reference difference frequency $v_{2S}-v_{1S}$.

* * * * *